(12) United States Patent
Koken et al.

(10) Patent No.: US 11,784,749 B2
(45) Date of Patent: Oct. 10, 2023

(54) POLAR CODING REED-MULLER NODE OPTIMIZATION USING FAST HADAMARD TRANSFORM

(71) Applicant: QUALCOMM Incorporated, San Diego, CA (US)

(72) Inventors: Erman Koken, La Jolla, CA (US); Gabi Sarkis, San Diego, CA (US); Hobin Kim, San Diego, CA (US); Hari Sankar, San Diego, CA (US); Omar Mehanna, San Diego, CA (US); Shravan Kumar Reddy Garlapati, San Diego, CA (US); Alessandro Risso, San Diego, CA (US); Afshin Haftbaradaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/651,058

(22) Filed: Feb. 14, 2022

(65) Prior Publication Data

US 2023/0261785 A1    Aug. 17, 2023

(51) Int. Cl.
*H04L 1/00*   (2006.01)
*H03M 13/13*  (2006.01)
*H03M 13/00*  (2006.01)
*H04B 1/7093* (2011.01)

(52) U.S. Cl.
CPC .......... *H04L 1/0057* (2013.01); *H03M 13/13* (2013.01); *H04B 1/7093* (2013.01); *H04L 1/0041* (2013.01); *H04B 2001/70935* (2013.01)

(58) Field of Classification Search
CPC .... H04L 1/0057; H04L 1/0041; H03M 13/13; H04B 1/7093; H04B 2001/70935
See application file for complete search history.

(56) References Cited

U.S. PATENT DOCUMENTS

| | | | |
|---|---|---|---|
| 9,887,805 B2* | 2/2018 | Litsyn | H03M 13/13 |
| 2012/0185755 A1* | 7/2012 | Orlik | H03M 13/136 |
| | | | 714/781 |
| 2017/0353271 A1* | 12/2017 | Kudekar | H03M 13/13 |
| 2019/0058490 A1* | 2/2019 | Klein | H03M 13/09 |
| 2019/0253213 A1* | 8/2019 | Garlapati | H04L 1/1845 |

* cited by examiner

*Primary Examiner* — Justin R Knapp
(74) *Attorney, Agent, or Firm* — Procopio, Cory, Hargreaves & Savitch

(57) ABSTRACT

An apparatus may be configured to receive a polar-encoded transmission comprising at least one intermediate node associated with a first configuration of frozen leaf nodes and information leaf nodes. The apparatus may further be configured to apply an FHT to a first set of values associated with a first intermediate node of the at least one intermediate node to generate a second set of values associated with the first intermediate node. The apparatus may also be configured to select, based on the second set of values, one or more paths associated with the first intermediate node for a SSCL decoding. The apparatus may further be configured to calculate a path metric for each of the selected one or more paths associated with the first intermediate node.

30 Claims, 15 Drawing Sheets

POLAR CODING REED-MULLER NODE OPTIMIZATION USING FAST HADAMARD TRANSFORM

TECHNICAL FIELD

The present disclosure relates generally to communication systems, and more particularly, to decoding of polar coded data.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a non-transitory computer-readable medium, and an apparatus are provided. The apparatus may be configured to receive a polar-encoded transmission including at least one intermediate node associated with a first configuration of frozen leaf nodes and information leaf nodes. The apparatus may further be configured to apply a Fast Hadamard Transform (FHT) to a first set of values associated with a first intermediate node of the at least one intermediate node to generate a second set of values associated with the first intermediate node. The apparatus may also be configured to select, based on the second set of values, one or more paths associated with the first intermediate node for a simplified successive cancellation list (SSCL) decoding. The apparatus may further be configured to calculate a path metric for each of the selected one or more paths associated with the first intermediate node.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
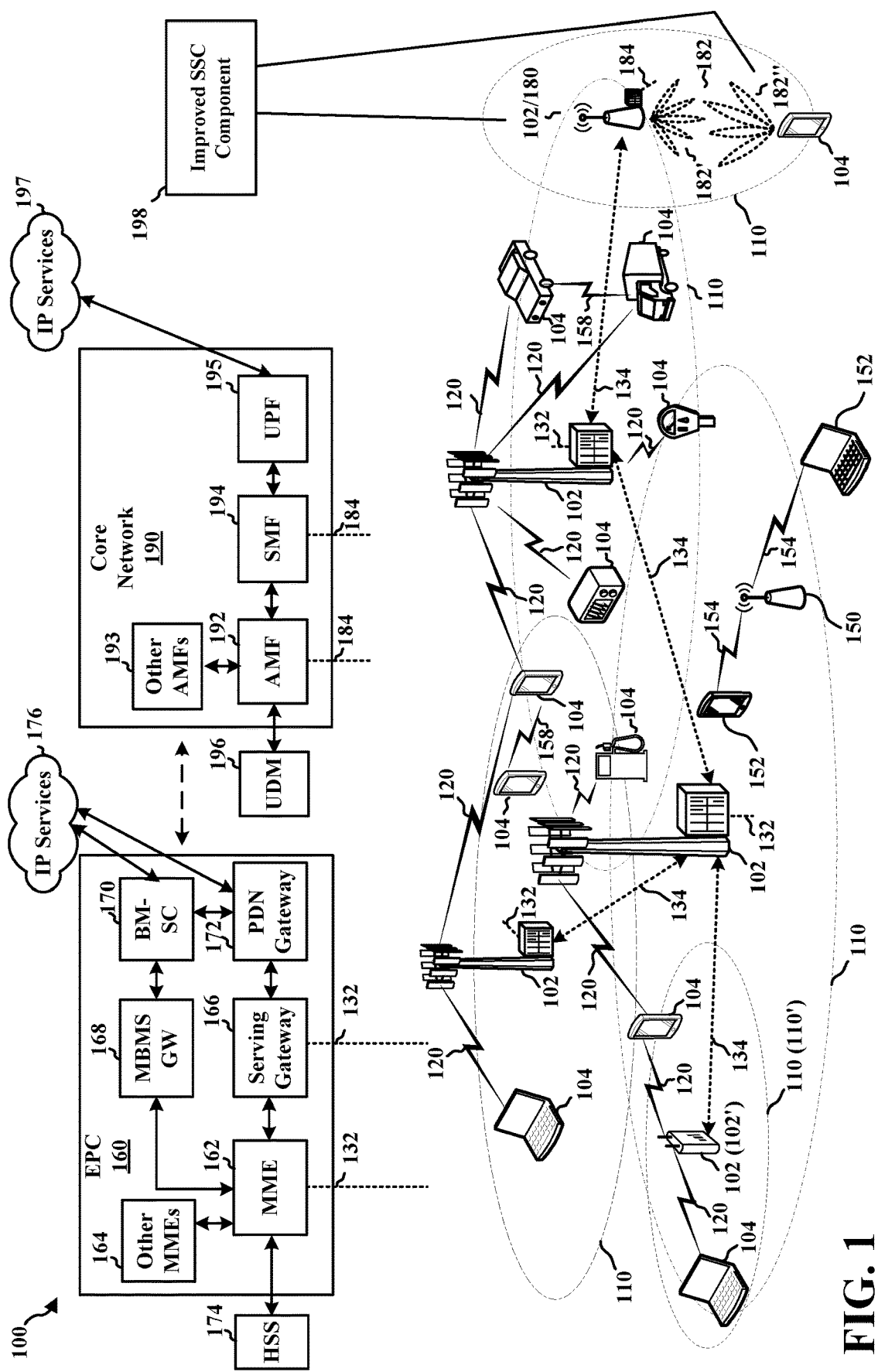
FIG. 1 is a diagram illustrating an example of a wireless communications system and an access network, in accordance with aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, aggregated or disaggregated components, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The wireless communication system may be implemented by a set of network nodes and/or a set of network entities. A network node can be implemented as an aggregated base station, as a disaggregated base station, an integrated access and backhaul (IAB) node, a relay node, a sidelink node, etc. A network entity can be implemented in an aggregated or monolithic base station architecture, or alternatively, in a disaggregated base station architecture, and may include one or more of a central unit (CU), a distributed unit (DU), a radio unit (RU), a Near-Real Time (Near-RT) RAN Intelligent Controller (RIC), or a Non-Real Time (Non-RT) RIC.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR2-2, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 and/or the base station 102/180 may include an improved simplified SC (SSC) component 198. The improved SSC component 198 may be configured to receive a polar-encoded transmission including at least one intermediate node associated with a first configuration of frozen leaf nodes and information leaf nodes. The improved SSC component 198 may further be configured to apply an FHT to a first set of values associated with a first intermediate node of the at least one intermediate node to generate a second set of values associated with the first intermediate node. The improved SSC component 198 may also be configured to select, based on the second set of values, one or more paths associated with the first intermediate node for a SSCL decoding. The improved SSC component 198 may further be configured to calculate a path metric for each of the selected one or more paths associated with the first intermediate node. Although the following description may be focused on 5G NR, the concepts described herein may be applicable to other similar areas, such as LTE, LTE-A, CDMA, GSM, and other wireless technologies.

Figures 2A, 2B, 2C, 2D:
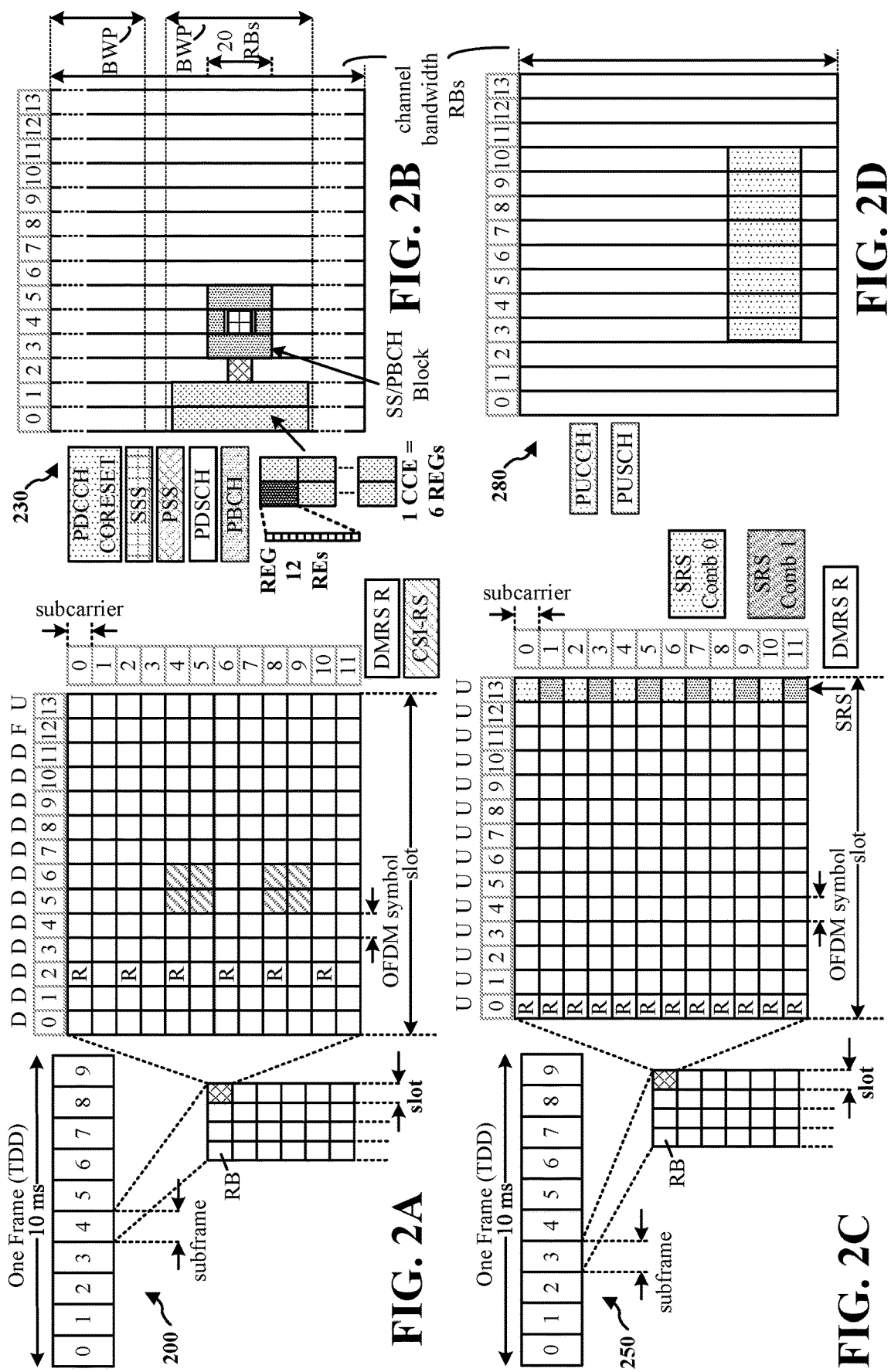
FIG. 2A is a diagram illustrating an example of a first subframe within a 5G NR frame structure, in accordance with aspects of the present disclosure.
FIG. 2B is a diagram illustrating an example of DL channels within a 5G NR subframe, in accordance with aspects of the present disclosure.
FIG. 2C is a diagram illustrating an example of a second subframe within a 5G NR frame structure, in accordance with aspects of the present disclosure.
FIG. 2D is a diagram illustrating an example of UL channels within a 5G NR subframe, in accordance with aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| $\mu$ | SCS<br>$\Delta f = 2^\mu \cdot 15$ [kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies $\mu$ 0 to 4 allow for 1, 2, 4, 8, and 16 slots, respectively, per subframe. For extended CP, the numerology 2 allows for 4 slots per subframe. Accordingly, for normal CP and numerology p, there are 14 symbols/slot and 2 slots/subframe. The subcarrier spacing may be equal to $2^\mu * 15$ kHz, where $\mu$ is the numerology 0 to 4. As such, the numerology $\mu=0$ has a subcarrier spacing of 15 kHz and the numerology $\mu=4$ has a subcarrier spacing of 240 kHz. The symbol length/duration is inversely related to the subcarrier spacing. FIGS. 2A-2D provide an example of normal CP with 14 symbols per slot and numerology $\mu=2$ with 4 slots per subframe. The slot duration is 0.25 ms, the subcarrier spacing is 60 kHz, and the symbol duration is approximately 16.67 $\mu$s. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
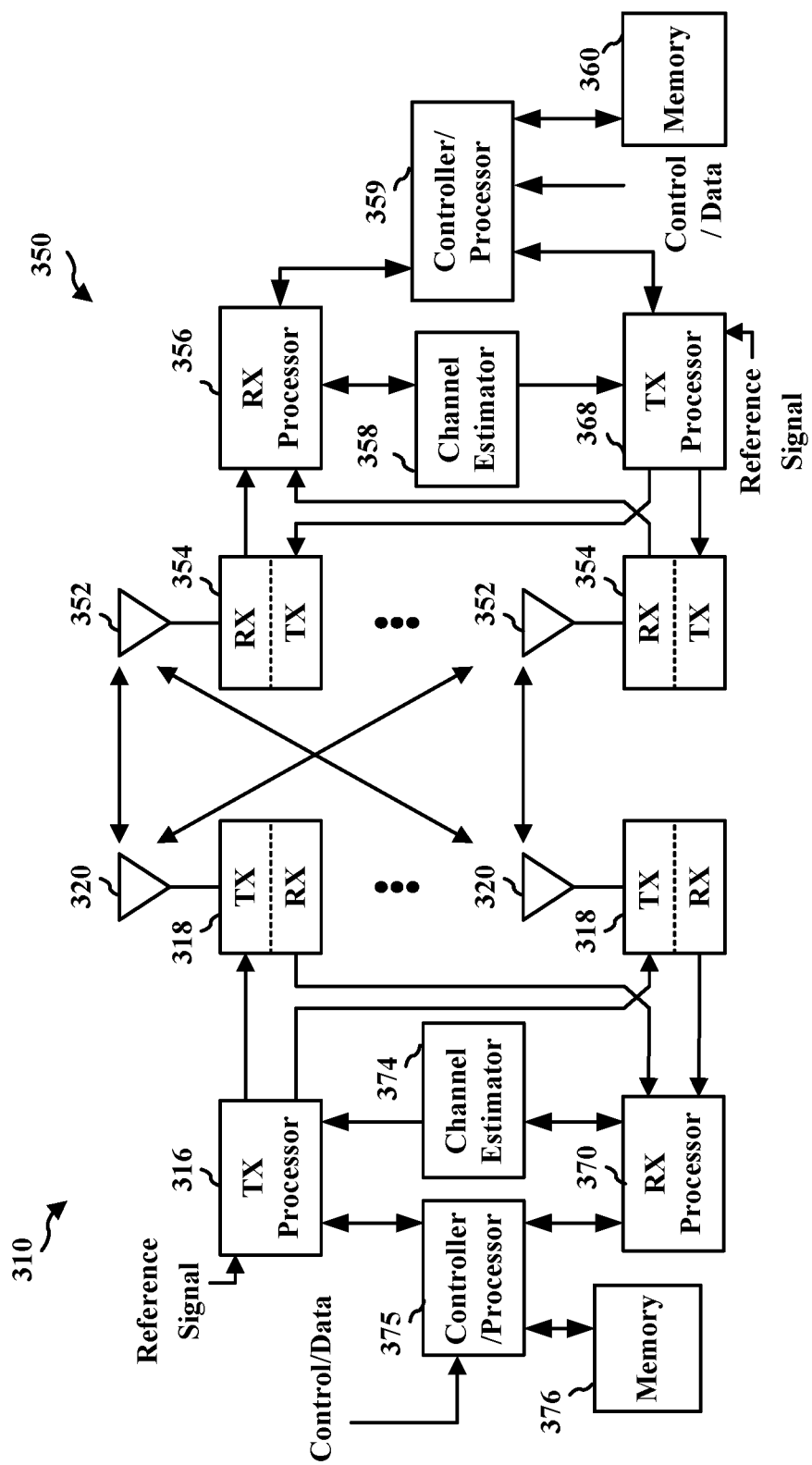
FIG. 3 is a block diagram of a base station in communication with a UE in an access network, in accordance with aspects of the present disclosure.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter at RX/TX 318. Each transmitter at RX/TX 318 may modulate a radio frequency (RF) carrier with a respective spatial stream for transmission.

At the UE 350, each receiver at RX/TX 354 receives a signal through its respective antenna 352. Each receiver at RX/TX 354 recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters at RX/TX 354. Each transmitter at RX/TX 354 may modulate an RF carrier with a respective spatial stream for transmission.

The UL transmission is processed at the base station 310 in a manner similar to that described in connection with the receiver function at the UE 350. Each receiver at RX/TX 318 receives a signal through its respective antenna 320. Each receiver at RX/TX 318 recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1. At least one of the TX processor 316, the RX processor 370, and the controller/processor 375 may be configured to perform aspects in connection with 198 of FIG. 1.

In some aspects of wireless communication, e.g., 5G NR, polar coding is used to code information for transmission. The polar coding may code a number, K, of information bits in a number, N, of independent channels. The K bits of information, in some aspects, are transmitted a set of K "strong" channels where K is less than N and the remaining N-K input bits are "frozen bits" (e.g., set to 0). The polar code may be generated based on a recursive coding structure.

Figure 4:
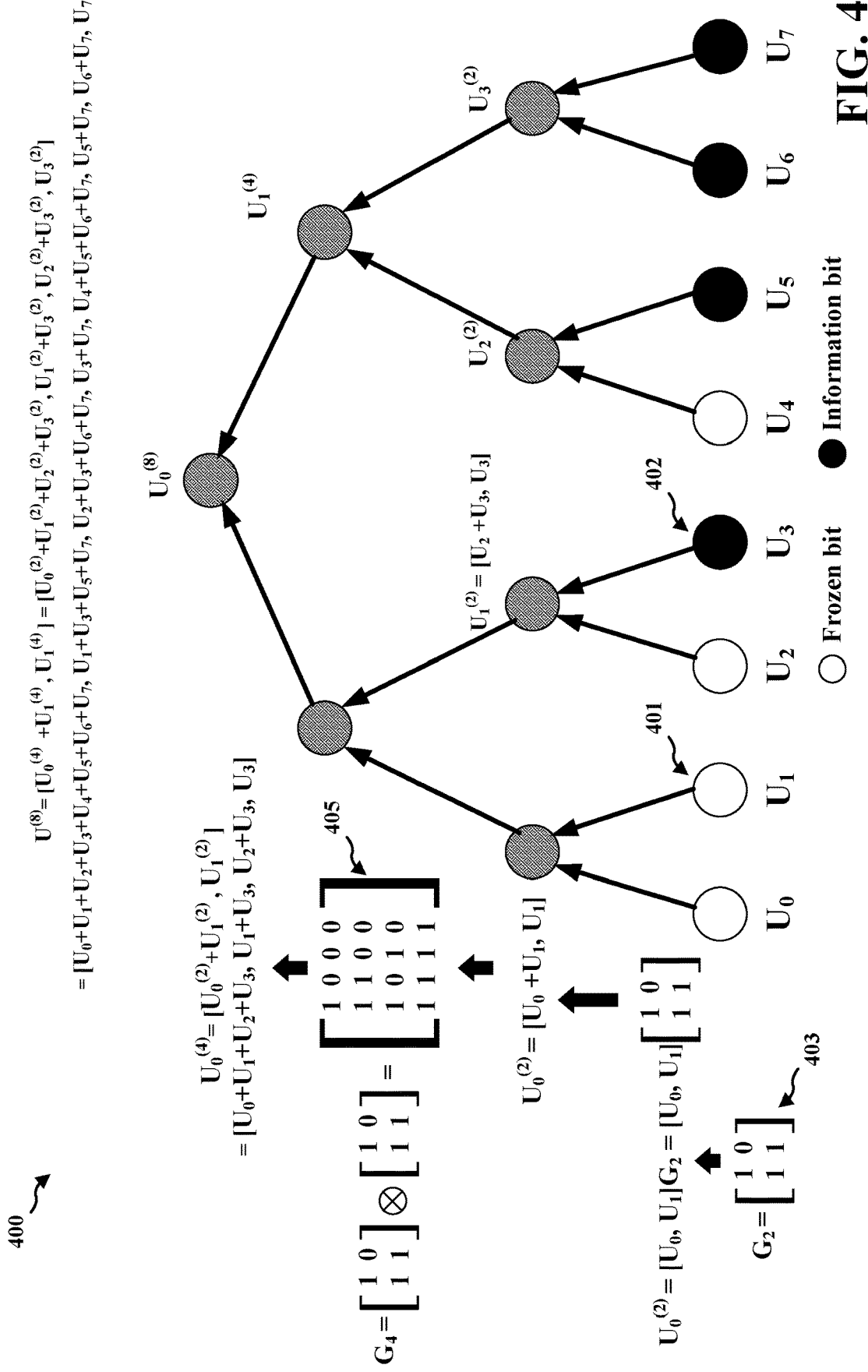
FIG. 4 is a diagram illustrating a recursive coding structure applied to a set of 8 bits including a set of frozen bits and a set of information bits, in accordance with aspects of the present disclosure.

FIG. 4 is a diagram 400 illustrating a recursive coding structure applied to a set of 8 bits including a set of frozen bits, e.g., frozen bit 401, and a set of information bits, e.g., information bits 402. The recursive coding may be based on a kernel 403 applied to bits in a pairwise fashion. For example, a kernel $$G_2 = \begin{bmatrix} 1 & 0 \\ 1 & 1 \end{bmatrix} 403$$

may be applied to a first pair of bits $U_0$ and $U_1$ at a first level to produce a codeword $U_0^{(2)}=[U_0+U_1, U_1]$ at a second level. The same kernel may be applied to each pair of bits at the first level as illustrated in diagram 400. A similar kernel $$G_4 = \begin{bmatrix} 1 & 0 \\ 1 & 1 \end{bmatrix} \otimes \begin{bmatrix} 1 & 0 \\ 1 & 1 \end{bmatrix} = 405$$

may be applied to each pair of codewords at the second level to produce a codeword at a third level and so on for higher levels as indicated in diagram 400 for a fourth level.

Figure 5:
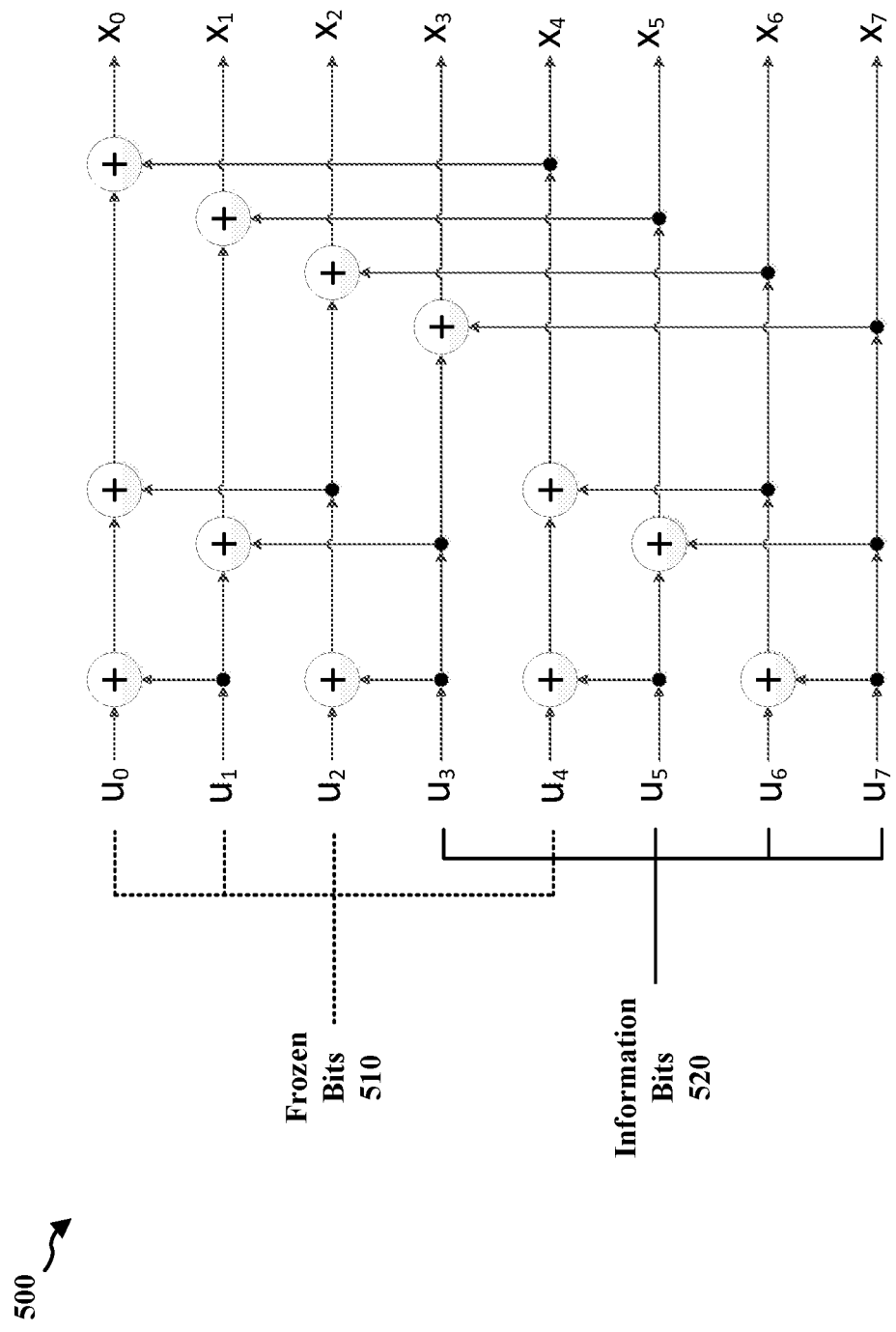
FIG. 5 illustrates an example of an encoder, in accordance with aspects of the present disclosure.

FIG. 5 illustrates an example 500 of an encoder. The example 500 of FIG. 5 shows the encoding of a RM code, where information bits 520 may be mapped to $U_3$, $U_5$, $U_6$, and $U_7$ while frozen bits 510 may be mapped to $U_0$, $U_1$, $U_2$, and $U_4$ to generate a (4,8) code. The RM code may be notated as (1, 3), where the order of the RM code is 1, and m=3, such that the coded length is 8, where $x_0$-$x_7$ denote the coded bits. The RM code may put information bits on the location of $U_3$, $U_5$, $U_6$, and $U_7$, while setting $U_0$, $U_1$, $U_2$, and $U_4$ to zero. The example 500 may represent the manner in which a RM code is encoded. The information bits are conveyed through the four locations $U_3$, $U_5$, $U_6$, and $U_7$. The encoding works by combining various bit locations and then following the encoding chain to get $x_0$, $x_1$, $x_2$, $x_3$, $x_4$, $x_5$, $x_6$, and $x_7$. For example, the information of $U_6$, is mapped to four positions in the codeword, namely, $x_0$, $x_2$, $x_4$, and $x_6$, such that each contains some information about $U_6$. The receiver may be provided information regarding the location of frozen bits and information bits and recursively decode the information bits.

Figure 6:
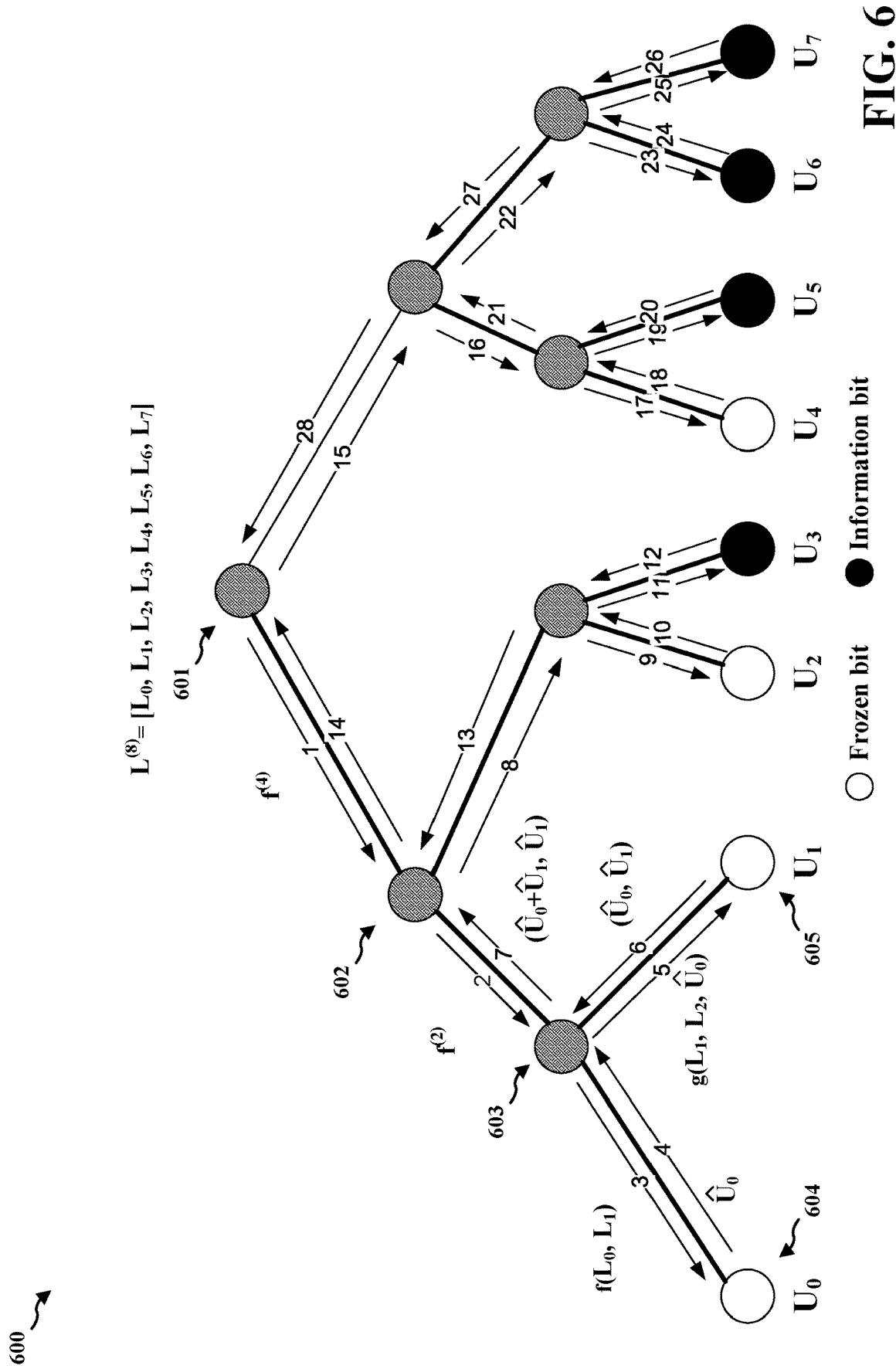
FIG. 6 illustrates elements of a basic successive cancellation (SC) decoding operation, in accordance with aspects of the present disclosure.

FIG. 6 illustrates elements of a basic successive cancellation (SC) decoding operation 600. For example, at a $4^{th}$ level the decoder may receive a set of bits $L^{(8)}$ that may represent a set of log likelihood ratios (LLRs) (e.g., $$\log \frac{Pr(c_i = 0|y)}{Pr(c_i = 1|y)} \Bigr)$$

corresponding to the coded bits (e.g., related to a received codeword). The operation 600 may decode the bits from left to right (from $U_0$ to $U_7$). In order to decode the 8 bits corresponding to the node 601, the decoder may compute a function $f^{(4)}$ that is based on the set of bits $L^{(8)}$ and pass the result to the node 602. The decoder may then compute a function $f^{(2)}$ based on the result of the function $f^{(4)}$. The result of the function $f^{(2)}$ may be passed to node 603 and the decoder may then compute a function of values from the set of bits in the set of bits $L^{(8)}$ (e.g., $f(L_1, L_2)$). Based on the function (or a known configuration), the decoder may determine a predicted and/or expected value (e.g., $\hat{U}_0=0$ for a frozen bit) for the first bit 604.

The decoder may pass the predicted and/or expected value back to the node 603. The decoder may calculate a value (e.g., $g(L_1, L_2, \hat{U}_0)$) based on the result of the function $f^{(2)}$ and the predicted and/or expected value (or a known configuration). The decoder may then determine a predicted and/or expected value (e.g., $\hat{U}_1=0$ for a frozen bit) for the second bit 605. A predicted and/or expected set of values (e.g., $[\hat{U}_0+\hat{U}_1, \hat{U}_1]$) may be associated with the node 603. The predicted and/or expected set of values may be passed to node 602 and the process may continue from left to right to decode the bits $\hat{U}_2$ to $\hat{U}_7$ based on a set of recursive information and/or a known configuration. For example, each node may perform the following operations in order, receiving a first set of LLRs from a parent node, sending a second set of LLRs calculated based on the received first set of LLRs to a left subnode, obtaining a bit decision from the left subnode (e.g., based on the left subnode performing these operations or a determination based on the second set of LLRs), calculate a third set of LLRs based on the received first set of LLRs for a right subnode, sending the third set of LLRs to the right subnode, obtaining the decoded bits from the right subnode, and, sending all the decoded bits to the parent node as indicated by the numbered arrows 1-28.

In some aspects of polar decoding, a parent node may be a special node for which faster and/or simpler processing may be performed. The polar decoding, in such, aspects may be a simplified SC (SSC) decoding that takes advantage of the ability to perform faster and/or simpler processing for the special nodes. For example, instead of traversing a subtree/subnodes associated with a special node simpler methods and/or calculations may be performed to decode the information bits associated with the special node. In some aspects, the special nodes are identified based on an identification of which bits contain information and which bits do not contain information (e.g., are frozen bits). The special nodes may be, e.g., a rate-0 node for which all input bits are frozen bits, a rate-1 node for which all input bits are information bits, a repetition (fast SSC) node for which all inputs are frozen except the last one, or an SPC (fast SSC) node for which all bits are information bits except the first bit.

Figure 7:
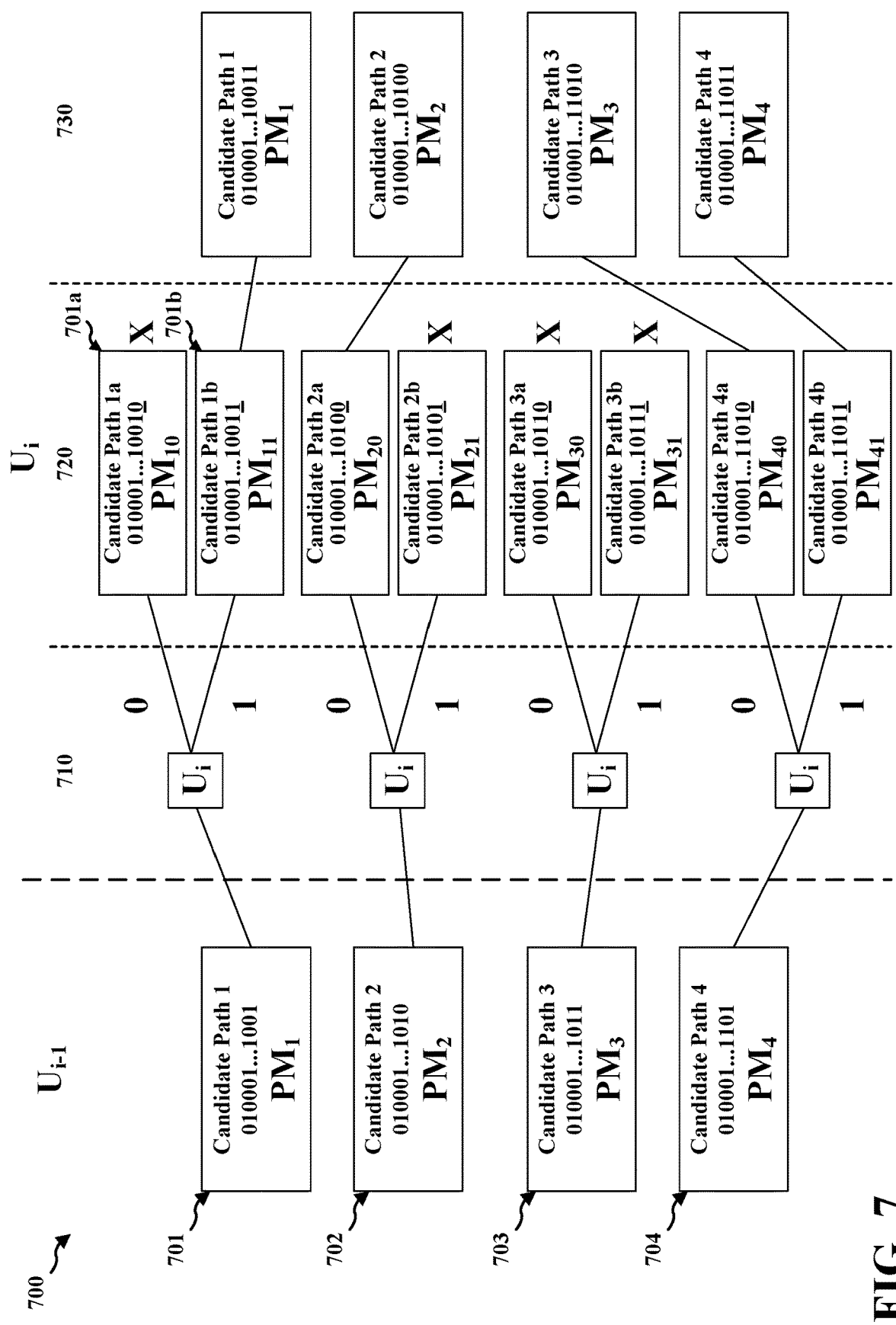
FIG. 7 is a diagram illustrating a set of four candidate paths maintained for an example decoding operation, in accordance with aspects of the present disclosure.

Some aspects of polar decoding, e.g., a SSC list (SSCL) decoder, maintain a list of most likely possible decodings (e.g., candidate paths) of the bits. FIG. 7 is a diagram 700 illustrating a set of four candidate paths (e.g., candidate path 701, candidate path 702, candidate path 703, and candidate path 704) maintained for an example decoding operation. In some aspects, the number of candidate paths maintained after each decoding may be more or less than four, where the limiting case of maintaining a list of 1 candidate path is equivalent to SSC. Each candidate path 701-704 may be associated with a corresponding path metric (e.g., $PM_1$-$PM_4$). The path metric, in some aspects, is based on the LLRs associated with a received polar encoded message. The candidate paths 701-704 may be associated with a node $U_{i-1}$ (e.g., associated with a set of decoded bits $U_0$-$U_{i-1}$).

For each of the candidate paths 701-704, a new path is generated for each possible decoding of a particular information bit, $U_i$. For example, candidate path 701 identified for $U_{i-1}$ may be associated at 720 with two possible candidate paths for $U_i$. For example, candidate path 701a may be associated with a decoding of bit $U_i$ as a "0" bit at 710 and candidate path 701b may be associated with a decoding of bit $U_i$ as a "1" bit at 710. Each candidate path may be associated with a path metric at 720. For example, candidate path 701a is associated with a path metric $PM_{10}$ while candidate path 701b is associated with a path metric $PM_{11}$. Based on the path metrics associated with each candidate path identified at 720, the decoder may select at 730 four candidate paths with the lowest path metrics from the possible candidate paths identified at 720.

SSCL decoding may be further improved by adding additional types of special nodes that may be processed more quickly. Aspects presented herein introduce an additional special node for SSCL (or SSC) decoding to provide further improvements over a SC decoding or SCL decoding. The additional special node may be a reed-muller node associated with 8 bits defined by having a frozen leaf node (e.g., a frozen bit) at each of a first leaf node, a second leaf node, a third leaf node, and a fifth leaf node and having an information leaf node (e.g., an information bit) at each of a fourth leaf node, a sixth leaf node, a seventh leaf node, and an eighth leaf node. Aspects presented herein may further provide a method for a simple and/or fast decoding of a reed-muller node and a calculation of a path metric used in selecting a set of candidate paths for a SSCL decoding.

Figure 8:
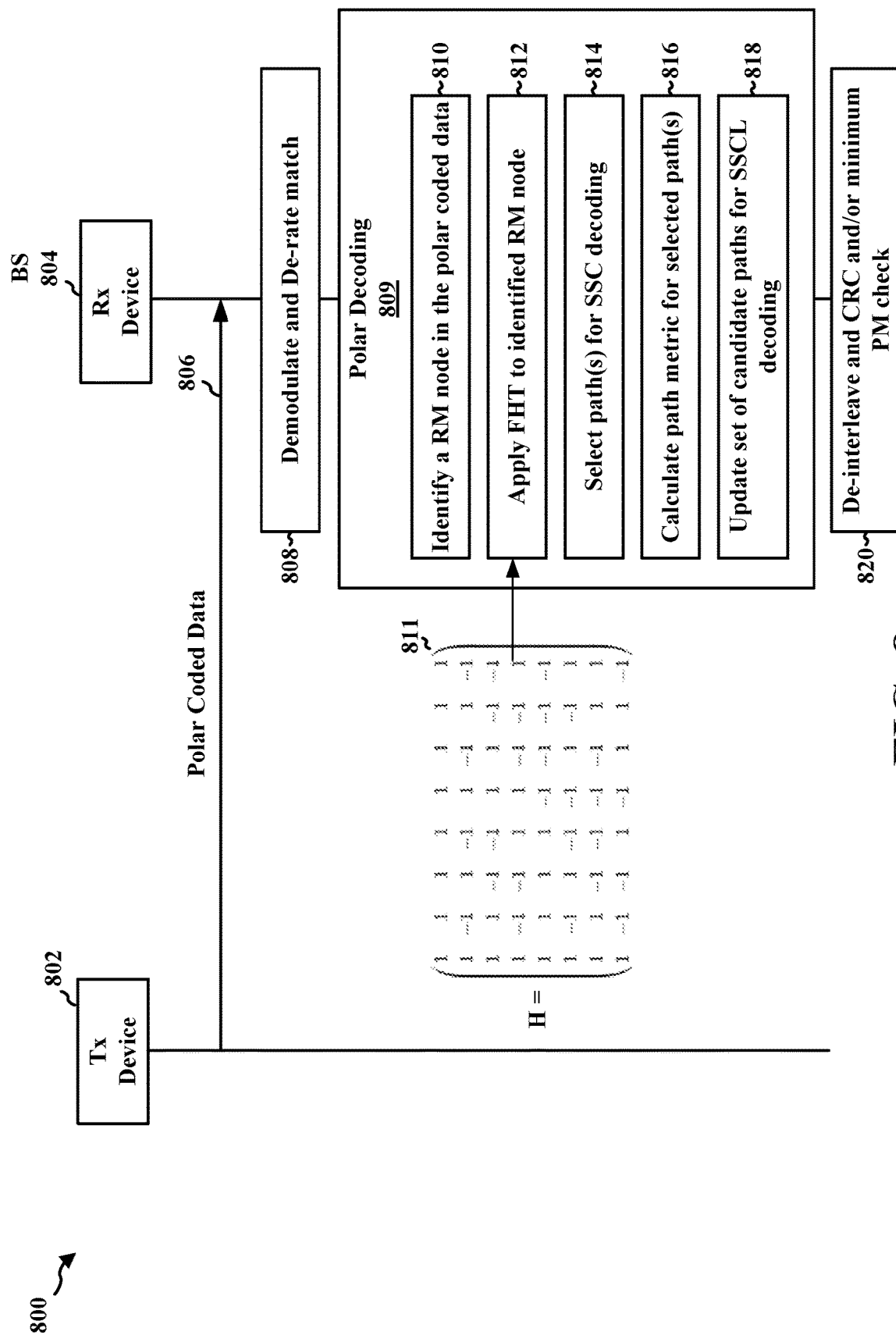
FIG. 8 is a call flow diagram illustrating a receiving (Rx) device performing a decoding operation for a reed-muller node included in polar coded data received from a transmitting (Tx) device, in accordance with aspects of the present disclosure.

FIG. 8 is a call flow diagram 800 illustrating a Rx device 804 performing a decoding operation for a reed-muller node included in polar coded data 806 received from a Tx device 802. Tx device 802 may send, and Rx device 804 may receive, polar coded data 806. The Rx device 804 may be one of a UE or a base station. The polar coded data 806, in some aspects, may include a set of bits for a cyclic redundancy checksum (CRC), e.g., a set of 24 bits appended to the transmitted message. The polar coded data 806 may include K information bits encoded in a codeword of length $N=2^n$, where N is selected based on an aggregation level.

After receiving the polar coded data 806, the Rx device 804 may demodulate and de-rate match 808 the received signal used to transmit the polar coded data 806. The Rx device 804 may then perform a polar decoding 809 on the demodulated and de-rate matched information (e.g., a set of N LLR bits). The polar decoding 809 may include a standard SSC or SSCL decoding operation for a set of nodes in a tree representation of the received set until reaching a RM node. Upon reaching the RM node, the Rx device 804 may identify 810 the node in the polar coded data as a RM node. The identification may be based on a known configuration of frozen and information bits associated with the polar coded data 806.

Based on identifying the node as a RM node, the Rx device 804 may apply 812 a fast-Hadamard-transform (FHT) to the LLRs associated with the RM node. The FHT may be an algorithm that calculates the multiplication of the LLRs with a Hadamard transform more quickly than performing the full multiplication. For example, a set of LLRs $[L_0, L_1, L_2, L_3, L_4, L_5, L_6, L_7]$ associated with the RM node may be transformed into a set of values $[y_0, y_1, y_2, y_3, y_4, y_5, y_6, y_7]$. For example, the FHT may be equivalent to applying the Hadamard transform (H) 811 to the set of 8 LLRs associated with the RM node such that $[y_0, y_1, y_2, y_3, y_4, y_5, y_6, y_7]=[L_0, L_1, L_2, L_3, L_4, L_5, L_6, L_7] \times H$).

Based on the transformed set of values $[y_0, y_1, y_2, y_3, y_4, y_5, y_6, y_7]$, the Rx device 804 may select 814 a set of paths (e.g., possible decodings of the bits associated with the RM node) for SSC decoding (e.g., one path for SSC decoding or multiple paths for SSCL decoding). For example, the Rx device 804 may select 814 the set of paths by selecting a set of values in the transformed set of values that will be used to define the set of paths. For example, the Rx device 804 may select a set of two or more values for path splitting in a SSCL decoding or a set of one value for a SSC decoding. The selected value(s) may be the value(s) with the largest absolute value(s) in the transformed values. The Rx device 804 may identify a first index $\hat{i}_0$ that is equal to an index associated with the value in the transformed set of values with a largest absolute value ($\hat{i}_0=\text{argmax}|y_i|$). The polar decoder may identify a second index $\hat{i}_1$ that is equal to an index associated with the value in the transformed set of values with a second-largest absolute value ($\hat{i}_1=\text{argmax}|y_i|$) for ($i \neq \hat{i}_0$). Additional indexes may be identified in some aspects, but for the discussion below two identified indexes will be assumed.

The indexes $\hat{i}_0$ and $\hat{i}_1$, in some aspects, determine the predicted and/or expected input bits $\hat{U}_1, \hat{U}_2$, and $\hat{U}_3$ (e.g., second, third, and fourth information bits corresponding to the sixth seventh and eighth bit of the binary tree representation of the RM node) based on the binary representation of the index value. For example, a most significant bit may correspond to $\hat{U}_3$ and a least significant bit may correspond to $\hat{U}_1$ with the remaining bit corresponding to $\hat{U}_2$. For example, for an index value $\hat{i}_0=0$ (000 in binary), the predicted and/or expected values $\hat{U}_1, \hat{U}_2$, and $\hat{U}_3$ may be 0, 0, and 0 respectively, while for an index value $\hat{i}_1=3$ (011 in binary), the predicted and/or expected values $\hat{U}_1, \hat{U}_2$, and $\hat{U}_3$ may be 1, 1, and 0 respectively. The predicted and/or expected value $\hat{U}_0$ (e.g., the first information bit corresponding to the fourth bit of the binary tree representation of the RM node) for each identified index may be determined based on the sign of the value ($y_i$) in the set of transformed values corresponding to the identified index. For example, if $y_i>0$ then a variable $\hat{v}$ may be set equal to 0 while if $y_i<0$ then $\hat{v}$ may be set equal to 1. The Rx device 804 may then determine $\hat{U}_0$ based on the following equation: $\hat{U}_0=\hat{v}\oplus\hat{U}_1\oplus\hat{U}_2\oplus\hat{U}_3$.

Figure 9:
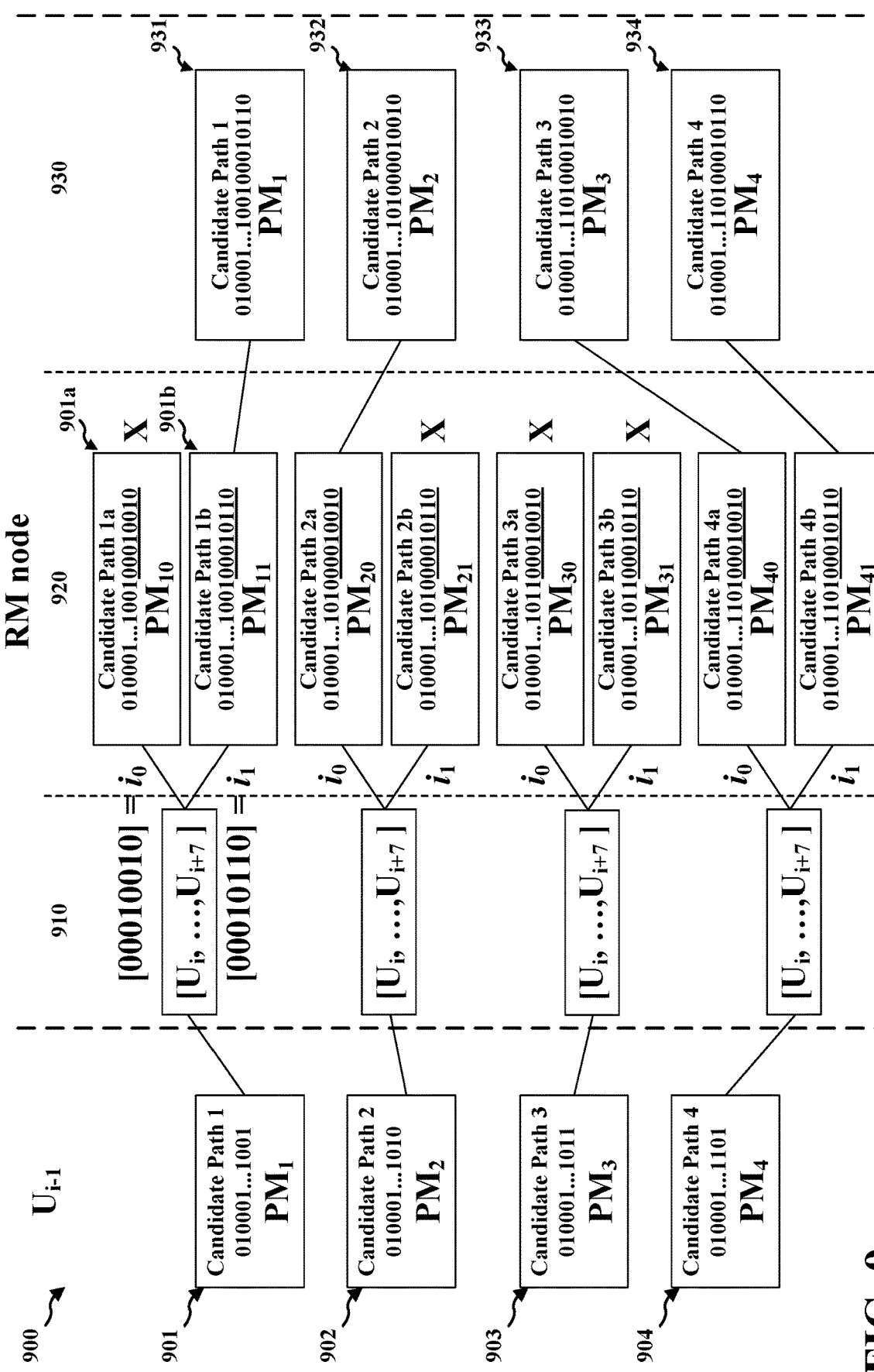
FIG. 9 is a diagram illustrating a path splitting based on a decoded Reed-Muller (RM) node, in accordance with aspects of the present disclosure.

Based on the identified values for $\hat{U}_0, \hat{U}_1, \hat{U}_2$, and $\hat{U}_3$ for each identified index, the Rx device 804 may perform a path splitting for each path in a set of candidate paths for the bits decoded prior to the RM node. FIG. 9 is a diagram 900 illustrating a path splitting based on a decoded RM node. FIG. 9 illustrates a set of candidate paths (e.g., candidate path 901, candidate path 902, candidate path 903, and candidate path 904) for the decoded bits prior to the RM node. FIG. 9 illustrates that two predicted and/or expected sets of values for the 8 bits of the RM node are produced at 910. As described above, this may be based on having the Rx device 804 identify 810 the node in the polar coded data as a RM node, apply 812 the FHT to the LLRs associated with the RM node, and select 814 a set of paths for SSC decoding.

The Rx device 804 may calculate 816 a path metric for each of the selected paths (e.g., each path associated with an identified index). To calculate 816 the path metric for each of the selected paths, the Rx device 804 may calculate the path metric (e.g., $PM_{\hat{i}_0}$ and $PM_{\hat{i}_1}$) associated with an index $j=(\hat{i}_0, \hat{i}_1)$ as $PM_j = 0.5((\Sigma|L_m|) - |y_j|)$, where $L_m = L_0, \ldots, L_7$ of a received set of LLRs associated with the RM node. The Rx device may then update 818 the set of candidate paths (e.g., codewords) for SSCL decoding. For example, for each of the two predicted and/or expected set of values for the 8 bits of the RM node produced at 910 (and/or selected 814), the polar decoder may generate a possible candidate path. As illustrated in FIG. 9, the Rx device may generate a first possible candidate path 901a associated with a first predicted and/or expected set of values based on $\hat{i}_0$ and a second possible candidate path 901b associated with a second predicted and/or expected set of values based on $\hat{i}_1$.

In some aspects, updating the set of possible paths for SSCL decoding includes updating and/or calculating the path metric for each possible candidate path identified at 920 (e.g., possible candidate path 901a or possible candidate path 901b). The Rx device, in some aspects, may calculate the path metric for each possible candidate path by adding a path metric associated with one of the selected paths associated with the RM node (e.g., $PM_{\hat{i}_0}$ or $PM_{\hat{i}_1}$) to the path metric (e.g., $PM_1$) for the candidate path (e.g., candidate path 901) from which the possible candidate path (e.g., 901a or 901b) branches and/or splits. For example, for possible candidate path 901a, the $PM_{10}$ associated with the identified index $\hat{i}_0$ may be calculated as $PM_1 + PM_{\hat{i}_0}$, while for possible candidate path 901b, the $PM_{11}$ associated with the identified index $\hat{i}_1$ may be calculated as $PM_1 + PM_{\hat{i}_1}$. As described in relation to FIG. 7, the updating of the candidate paths may include selecting a set of candidate paths (e.g., candidate path 931, candidate path 932, candidate path 933, candidate path 934) from the set of possible candidate paths (e.g., 901a and 901b) identified and/or generated at 920. The set of candidate paths identified at 930 (e.g., candidate paths 931-934) may include a set of selected possible candidate paths with path metrics that are lower than the unselected possible candidate paths. For example, for a candidate path list with L members (L=4 in the example of FIGS. 7 and 9), the L possible candidate paths with the L lowest path metrics may be selected as the candidate paths for decoding a next bit or node.

The polar decoding may continue decoding subsequent bits and/or nodes including special nodes (e.g., additional RM nodes, rate-0 nodes, rate-1 nodes, a repetition node, or an SPC node). After the polar decoding 809 is complete, the Rx device may de-interleave and perform a CRC and/or minimum path metric check 820 to identify a path from the candidate paths that is consistent with a CRC and/or has a lowest path metric. The identified path is then selected as the data transmitted by the Tx device 802.

Figure 10:
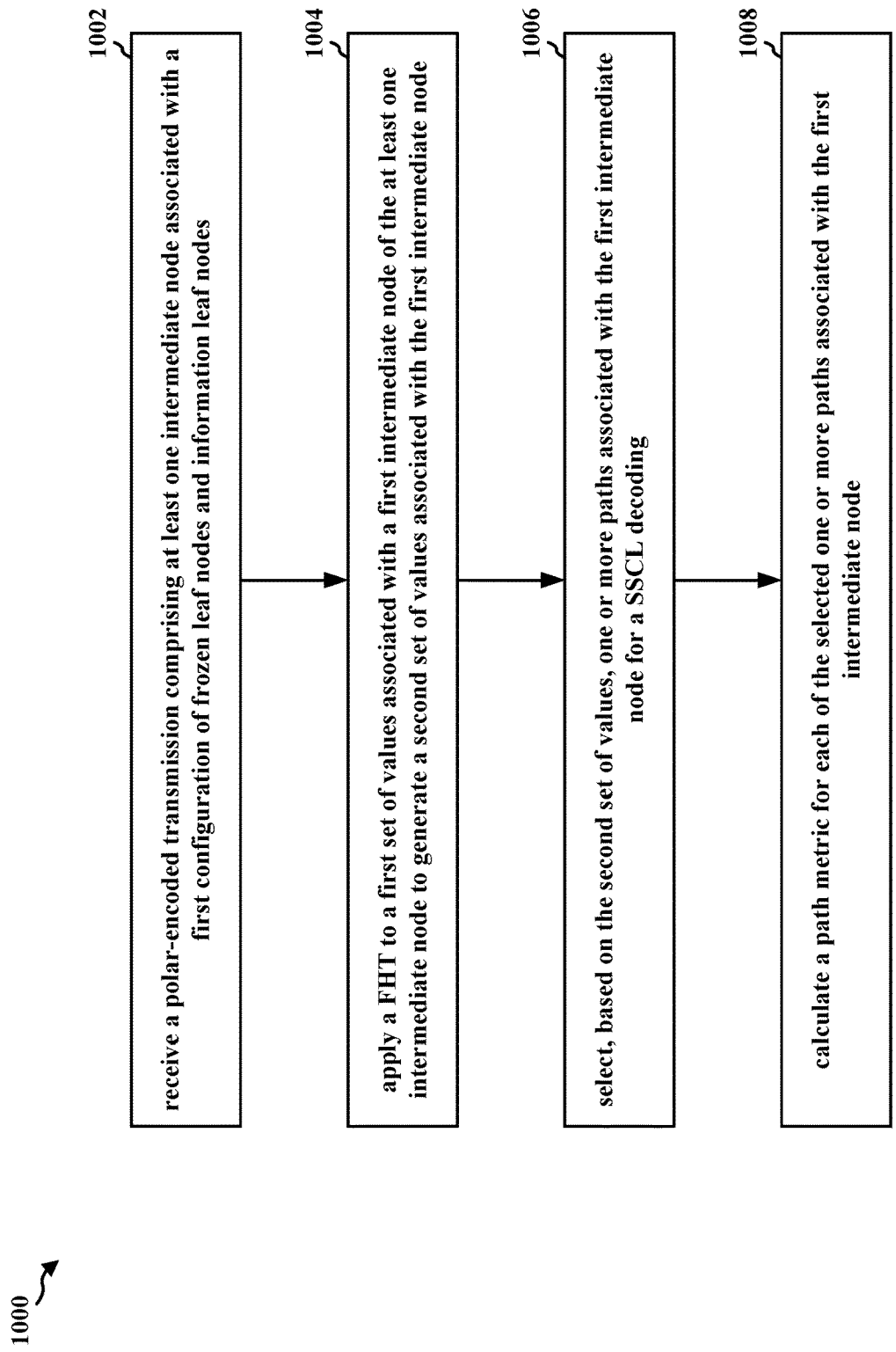
FIG. 10 is a flowchart of a method of wireless communication, in accordance with aspects of the present disclosure.

FIG. 10 is a flowchart of a method 1000 of wireless communication, in accordance with aspects of the present disclosure. The method may be performed by a Rx device (e.g., Rx device 804; the UE 104; the apparatus 1402; the base station 102/180; the apparatus 1502). At 1002, the Rx device may receive a polar-encoded transmission including at least one intermediate node associated with a first configuration of frozen leaf nodes and information leaf nodes.

For example, 1002 may be performed by reception component 1430 and/or 1530. In some aspects, the at least one intermediate node includes at least one Reed-Muller node associated with a set of eight leaf nodes and the first configuration of the frozen leaf nodes and the information leaf nodes includes a frozen leaf node at a first leaf node, a second leaf node, a third leaf node, and a fifth leaf node and an information leaf node at a fourth leaf node, a sixth leaf node, a seventh leaf node, and an eighth leaf node. For example, referring to FIGS. 4 and 8, the Rx device 804 may receive the polar coded data 806 that includes at least one node with the configuration of frozen and information nodes illustrated in diagram 400.

The received polar-encoded transmission, in some aspects, may be associated with a known configuration of the frozen leaf nodes and the information leaf nodes including the first configuration. In some aspects, the Rx device may identify the at least one intermediate node based on the known configuration. For example, referring to FIGS. 8, 14, and 15, The Rx device 804 may identify 811 the RM node in the polar coded data 806 using one of RM node identification component 1440 and/or RM node identification component 1540.

At 1004, the Rx device may apply an FHT to a first set of values (e.g., LLRs) associated with a first intermediate node of the at least one intermediate node to generate a second set of values (e.g., $y_i$ for $i=0, \ldots, 7$) associated with the first intermediate node. For example, 1004 may be performed by FHT component 1442 or FHT component 1542. In some aspects, the first set of values associated with the first intermediate node includes a set of LLR values calculated based on the received polar encoded transmission. For example, referring to FIGS. 6 and 8, the Rx device 804 may apply 812 an FHT to the set of LLRs (e.g., $L^{(8)}$ of FIG. 6) associated with the RM node to generate the set of values $[y_0, y_1, y_2, y_3, y_4, y_5, y_6, y_7]$.

At 1006, the Rx device may select, based on the second set of values, one or more paths associated with the first intermediate node for a SSCL decoding. For example, 1006 may be performed by RM node evaluation component 1444 or RM node evaluation component 1544. In some aspects, selecting the one or more paths includes selecting a first number of paths (e.g., candidate decodings of the bits associated with the identified RM node). The first number, in some aspects, may be less than, or equal to, a number of candidate codewords (e.g., candidate paths) maintained by the SSCL decoding after a pruning operation. In some aspects, selecting the first number of paths includes selecting a subset of values in the second set of values. The selected subset of values, in some aspects, may include a second number of values having a magnitude greater than one or more values in the second set of values that are not included in the selected subset of values. For example, the selected subset of values may include the second number of values with the largest absolute values. In some aspects, the second number may be equal to the first number of paths and each value in the selected subset of values corresponds to a different path in the first number of paths.

Selecting the first number of paths, in some aspects, may further include identifying an index associated with each value in the selected subset of values. The Rx device may further identify, for each value in the subset of values, a corresponding path in the first number of paths based on the identified index and a sign of the value in the subset of values. The identified index, in some aspects, may identify expected values for three bits of encoded information. In some aspects, an expected value for a fourth bit of encoded information may be identified based on the expected values for the three bits of encoded information and the sign of the value in the subset of values. For example, in some aspects, a binary representation of each index associated with a value in the second set of values corresponds to the expected value of the three bits in a particular order, where the particular order is a same order for each index.

For example, referring to FIGS. 8 and 9, the Rx device 804 may select 814 a set of paths for SSC decoding. As discussed above, the Rx device 804 may select a set of value(s) with the largest absolute value(s) in the transformed values and identify a set of indexes including one index corresponding to each of the selected set of values. Each index i corresponding to a particular value $y_i$ in the selected set of values may identify a predicted and/or an expected value for three information bits of the selected path associated with the particular value. A predicted and/or expected value for a fourth information bit may be determined based on the predicted and/or expected value for the three information bits and the sign of the particular value $y_i$ (e.g., $\hat{U}_0 = \hat{v} \oplus \hat{U}_1 \oplus \hat{U}_2 \oplus \hat{U}_3$ as described above in relation to FIG. 8).

Finally, at 1008, the Rx device may calculate a path metric for each of the selected one or more paths associated with the first intermediate node. For example, 1008 may be performed by path metric calculation component 1446 or path metric calculation component 1546. Calculating the path metric for a particular selected path of the one or more selected paths, in some aspects, includes calculating the path metric for the particular selected path based on the first set of values associated with the first intermediate node and the second set of values associated with the first intermediate node. For example, in some aspects, calculating the path metric for the particular selected path includes calculating a first value based on a difference between a magnitude of a second value in the second set of values that corresponds to the particular selected path and a sum of magnitudes of values in the first set of values (e.g., $PM_1 = 0.5((\Sigma|L_m|) - |y_j|)$, where $L_m = L_0, \ldots, L_7$ is the first set of values and $y_j$ is the $j^{th}$ value in the second set of values). For example, referring to FIG. 8, the Rx device 804 may calculate 816 a path metric for each of the selected paths. The Rx device may then update, based on the one or more selected paths and the calculated path metrics for each of the selected one or more paths, a list of candidate codewords maintained for the SSCL decoding. The update may include generating a list of possible candidate codewords based on the list of candidate codewords and the one or more selected paths (e.g., generating a list of possible candidate codewords for a next decoding operation by path splitting as described in relation to FIG. 9). The update may also include calculating a first path metric for each possible candidate codeword in the list of possible candidate codewords. The list of possible candidate codewords may then be pruned by removing a third number of codewords with a highest path metric from the list of possible candidate codewords, where the third number of codewords is based on at least one of a first number of selected paths associated with the first intermediate node or a configured number of candidate codewords to maintain after each successive coding operation of the SSCL decoding. The polar decoding may then proceed to decode a next bit or node based on the updated list of candidate codewords (or paths).

Figure 11:
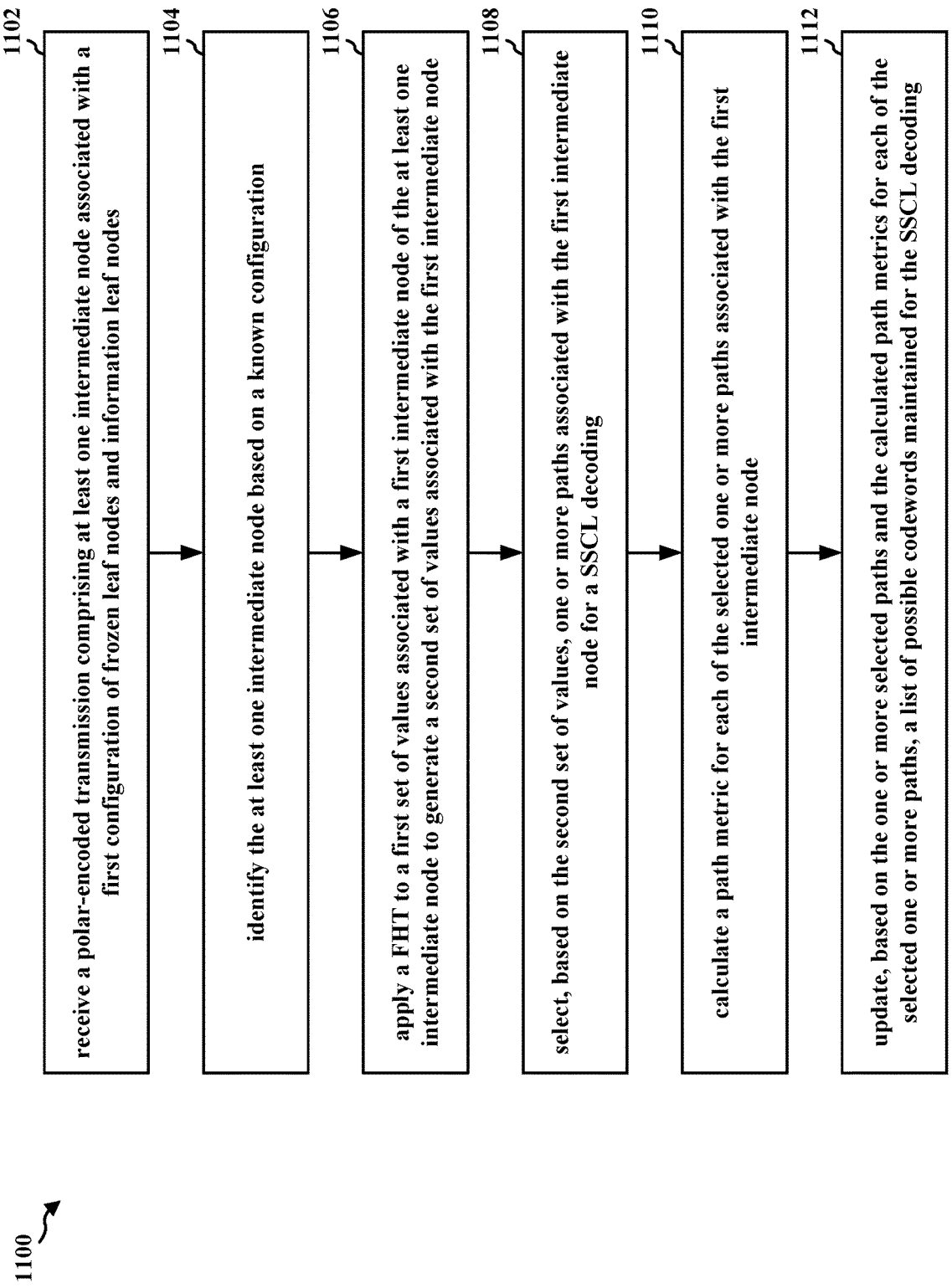
FIG. 11 is a flowchart of a method of wireless communication, in accordance with aspects of the present disclosure.

FIG. 11 is a flowchart of a method 1100 of wireless communication, in accordance with aspects of the present disclosure. The method may be performed by a Rx device (e.g., Rx device 804; the UE 104; the apparatus 1402; the base station 102/180; the apparatus 1502). At 1102, the Rx device may receive a polar-encoded transmission including at least one intermediate node associated with a first configuration of frozen leaf nodes and information leaf nodes. For example, 1102 may be performed by reception component 1430 and/or 1530 In some aspects, the at least one intermediate node includes at least one Reed-Muller node associated with a set of eight leaf nodes and the first configuration of the frozen leaf nodes and the information leaf nodes includes a frozen leaf node at a first leaf node, a second leaf node, a third leaf node, and a fifth leaf node and an information leaf node at a fourth leaf node, a sixth leaf node, a seventh leaf node, and an eighth leaf node. For example, referring to FIGS. 4 and 8, the Rx device 804 may receive the polar coded data 806 that includes at least one node with the configuration of frozen and information nodes illustrated in diagram 400.

The received polar-encoded transmission, in some aspects, may be associated with a known configuration of the frozen leaf nodes and the information leaf nodes including the first configuration. At 1104, the Rx device may identify the at least one intermediate node based on the known configuration. For example, referring to FIGS. 8, 14, and 15, the Rx device 804 may identify 811 the RM node in the polar coded data 806 using one of RM node identification component 1440 and/or RM node identification component 1540.

At 1106, the Rx device may apply an FHT to a first set of values (e.g., LLRs) associated with a first intermediate node of the at least one intermediate node to generate a second set of values $y_i$ for $i=0, \ldots, 7$ associated with the first intermediate node. For example, 1106 may be performed by FHT component 1442 or FHT component 1542. In some aspects, the first set of values associated with the first intermediate node includes a set of LLR values calculated based on the received polar encoded transmission. For example, referring to FIGS. 6 and 8, the Rx device 804 may apply 812 an FHT to the set of LLRs (e.g., $L^{(8)}$ of FIG. 6) associated with the RM node to generate the set of values $[y_0, y_1, y_2, y_3, y_4, y_5, y_6, y_7]$.

At 1108, the Rx device may select, based on the second set of values, one or more paths associated with the first intermediate node for a SSCL decoding. For example, 1108 may be performed by RM node evaluation component 1444 or RM node evaluation component 1544. In some aspects, selecting the one or more paths includes selecting a first number of paths (e.g., candidate decodings of the bits associated with the identified RM node). The first number, in some aspects, may be less than, or equal to, a number of candidate codewords (e.g., candidate paths) maintained by the SSCL decoding after a pruning operation. In some aspects, selecting the first number of paths includes selecting a subset of values in the second set of values. The selected subset of values, in some aspects, may include a second number of values having a magnitude greater than one or more values in the second set of values that are not included in the selected subset of values. For example, the selected subset of values may include the second number of values with the largest absolute values. In some aspects, the second number of values may be equal to the first number of paths and each value in the selected subset of values corresponds to a different path in the first number of paths.

Selecting the first number of paths, in some aspects, may further include identifying an index associated with each value in the selected subset of values. The Rx device may further identify, for each value in the subset of values, a corresponding path in the first number of paths based on the identified index and a sign of the value in the subset of values. The identified index, in some aspects, may identify expected values for three bits of encoded information. In some aspects, an expected value for a fourth bit of encoded information may be identified based on the expected values for the three bits of encoded information and the sign of the value in the subset of values. For example, in some aspects, a binary representation of each index associated with a value in the second set of values corresponds to the expected value of the three bits in a particular order, where the particular order is a same order for each index.

For example, referring to FIGS. 8 and 9, the Rx device 804 may select 814 a set of paths for SSC decoding. As discussed above, the Rx device 804 may select a set of value(s) with the largest absolute value(s) in the transformed values and identify a set of indexes including one index corresponding to each of the selected set of values. Each index i corresponding to a particular value $y_i$ in the selected set of values may identify a predicted and/or an expected value for three information bits of the selected path associated with the particular value. A predicted and/or expected value for a fourth information bit may be determined based on the predicted and/or expected value for the three information bits and the sign of the particular value $y_i$ (e.g., $\hat{U}_0 = \hat{v} \oplus \hat{U}_1 \oplus \hat{U}_2 \oplus \hat{U}_3$ as described above in relation to FIG. 8).

At 1110, the Rx device may calculate a path metric for each of the selected one or more paths associated with the first intermediate node. For example, 1110 may be performed by path metric calculation component 1446 or path metric calculation component 1546. Calculating the path metric for a particular selected path of the one or more selected paths, in some aspects, includes calculating the path metric for the particular selected path based on the first set of values associated with the first intermediate node and the second set of values associated with the first intermediate node. For example, in some aspects, calculating the path metric for the particular selected path includes calculating a first value based on a difference between a magnitude of a second value in the second set of values that corresponds to the particular selected path and a sum of magnitudes of values in the first set of values (e.g., $PM_j = 0.5((\Sigma|L_m|) - |y_j|)$, where $L_m = L_0, \ldots, L_7$ is the first set of values and $y_j$ is the $j^{th}$ value in the second set of values). For example, referring to FIG. 8, the Rx device 804 may calculate 816 a path metric for each of the selected paths.

Finally, at 1112, the Rx device may update, based on the one or more selected paths and the calculated path metrics for each of the selected one or more paths, a list of candidate codewords maintained for the SSCL decoding. For example, 1112 may be performed by path selection component 1448 or path selection component 1548 in conjunction with path metric calculation component 1446 or path metric calculation component 1546, respectively. The update may include generating a list of possible candidate codewords based on the list of candidate codewords and the one or more selected paths (e.g., generating a list of possible candidate codewords for a next decoding operation by path splitting as described in relation to FIG. 9). The update may also include calculating a first path metric for each possible candidate codeword in the list of possible candidate codewords. The list of possible candidate codewords may then be pruned by removing a third number of codewords with a highest path metric from the list of possible candidate codewords. The third number of codewords, in some aspects, may be based on at least one of a first number of selected paths associated with the first intermediate node or a configured number of candidate codewords to maintain after each successive coding operation of the SSCL decoding. The polar decoding may then proceed to decode a next bit or node based on the updated list of candidate codewords (or paths).

Figure 12:
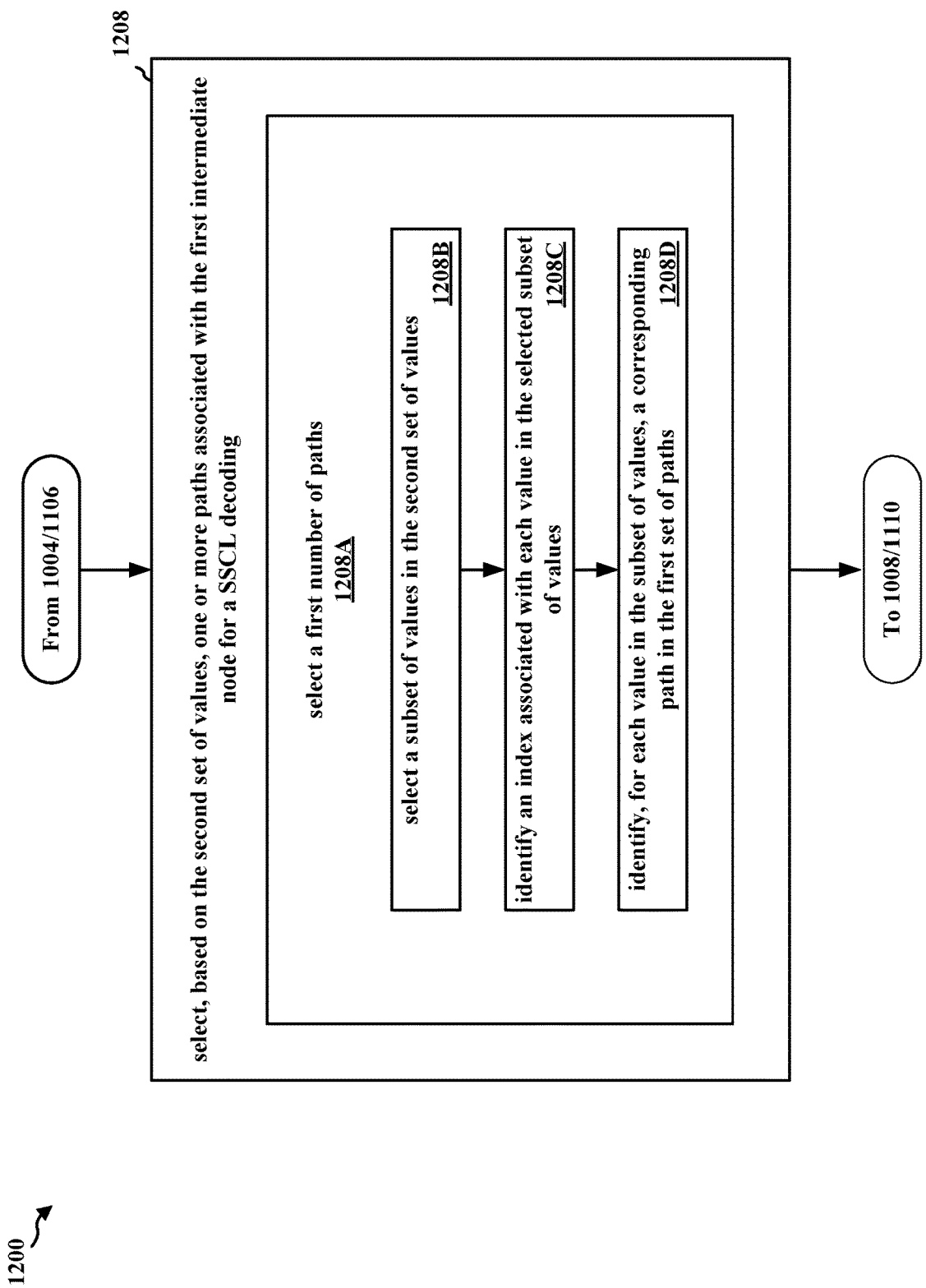
FIG. 12 is a flow diagram illustrating a method of selecting one or more paths associated with the first intermediate node for a SSCL decoding based on the second set of values, in accordance with aspects of the present disclosure.

FIG. 12 is a flow diagram 1200 illustrating a method of selecting, at 1006 and/or 1108, one or more paths associated with the first intermediate node for a SSCL decoding based on the second set of values. In some aspects, selecting, at 1208 (corresponding to the selecting at 1006 and/or 1108), the one or more paths includes selecting, at 1208A a first number of paths (e.g., candidate decodings of the bits associated with the identified RM node). The first number, in some aspects, may be less than, or equal to, a number of candidate codewords (e.g., candidate paths) maintained by the SSCL decoding after a pruning operation. In some aspects, selecting the first number of paths includes selecting, at 1208B, a subset of values in the second set of values. The selected subset of values, in some aspects, may include a second number of values having a magnitude greater than one or more values in the second set of values that are not included in the selected subset of values. For example, the selected subset of values may include the second number of values with the largest absolute values. In some aspects, the second number of values may be equal to the first number of paths and each value in the selected subset of values corresponds to a different path in the first number of paths.

Selecting the first number of paths, in some aspects, may further include identifying, at 1208C, an index associated with each value in the selected subset of values. At 1208D, the Rx device may further identify, for each value in the subset of values, a corresponding path in the first number of paths based on the identified index and a sign of the value in the subset of values. The identified index, in some aspects, may identify expected values for three bits of encoded information. In some aspects, an expected value for a fourth bit of encoded information may be identified based on the expected values for the three bits of encoded information and the sign of the value in the subset of values. For example, in some aspects, a binary representation of each index associated with a value in the second set of values corresponds to the expected value of the three bits in a particular order, where the particular order is a same order for each index.

For example, referring to FIGS. 8 and 9, the Rx device 804 may select 814 a set of paths for SSC decoding. As discussed above, the Rx device 804 may select a set of value(s) with the largest absolute value(s) in the transformed values and identify a set of indexes including one index corresponding to each of the selected set of values. Each index i corresponding to a particular value $y_i$ in the selected set of values may identify a predicted and/or an expected value for three information bits of the selected path associated with the particular value. A predicted and/or expected value for a fourth information bit may be determined based on the predicted and/or expected value for the three information bits and the sign of the particular value $y_i$ (e.g., $\hat{U}_0 = \hat{v} \oplus \hat{U}_1 \oplus \hat{U}_2 \oplus \hat{U}_3$ as described above in relation to FIG. 8).

Figure 13:
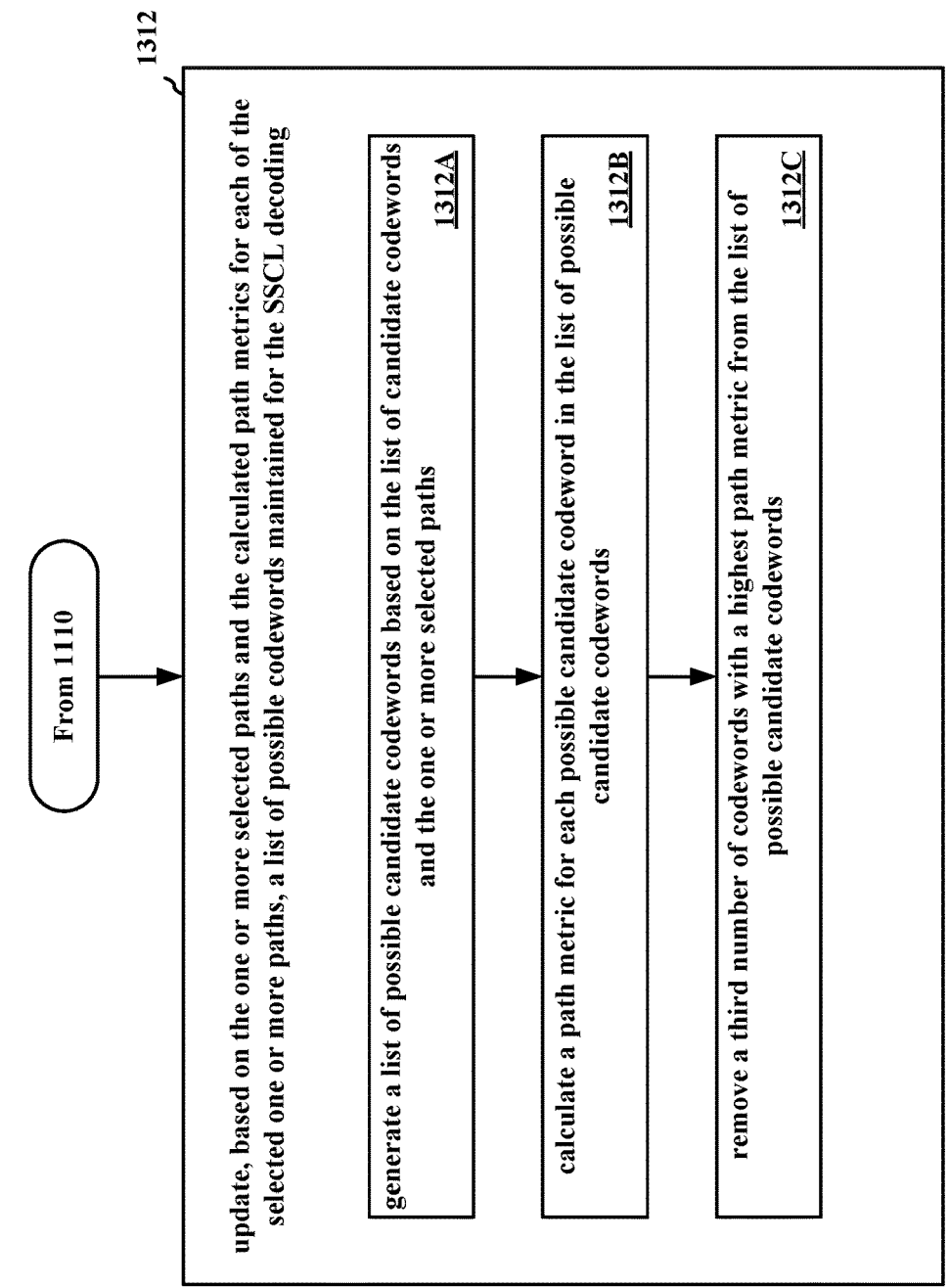
FIG. 13 is a flow diagram illustrating a method of updating codewords maintained for the SSCL decoding based on the one or more selected paths and the calculated path metrics for each of the selected one or more paths, in accordance with aspects of the present disclosure.

FIG. 13 is a flow diagram 1300 illustrating a method of updating, at 1112, a list of candidate codewords maintained for the SSCL decoding based on the one or more selected paths and the calculated path metrics for each of the selected one or more paths. Updating, at 1312 (corresponding to the updating at 1112), the list of candidate codewords may include generating, at 1312A, a list of possible candidate codewords based on the list of candidate codewords and the one or more selected paths (e.g., generating a list of possible candidate codewords for a next decoding operation by path splitting as described in relation to FIG. 9). The update, at 1312, may also include calculating 1312B a path metric for each possible candidate codeword in the list of possible candidate codewords. The list of possible candidate codewords may then be pruned by removing, at 1312C, a third number of codewords with a highest path metric from the list of possible candidate codewords. The third number of codewords, in some aspects, may be based on at least one of a first number of selected paths associated with the first intermediate node or a configured number of candidate codewords to maintain after each successive coding operation of the SSCL decoding. The polar decoding may then proceed to decode a next bit or node based on the updated list of candidate codewords (or paths).

Figure 14:
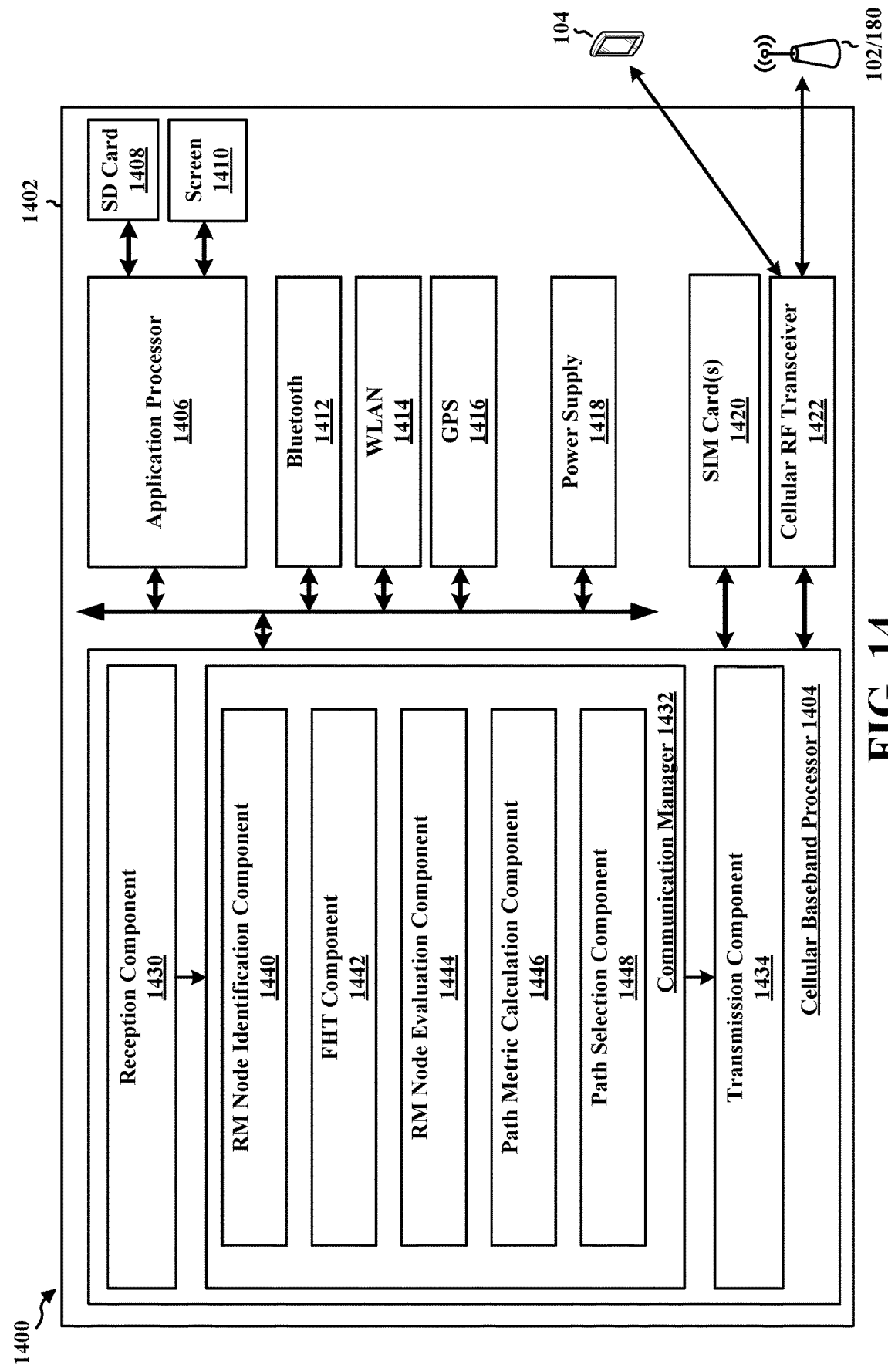
FIG. 14 is a diagram illustrating an example of a hardware implementation for an apparatus, in accordance with aspects of the present disclosure.

FIG. 14 is a diagram 1400 illustrating an example of a hardware implementation for an apparatus 1402. The apparatus 1402 may be a UE, a component of a UE, or may implement UE functionality. In some aspects, the apparatus 1402 may include a cellular baseband processor 1404 (also referred to as a modem) coupled to a cellular RF transceiver 1422. In some aspects, the apparatus 1402 may further include one or more subscriber identity modules (SIM) cards 1420, an application processor 1406 coupled to a secure digital (SD) card 1408 and a screen 1410, a Bluetooth module 1412, a wireless local area network (WLAN) module 1414, a Global Positioning System (GPS) module 1416, or a power supply 1418. The cellular baseband processor 1404 communicates through the cellular RF transceiver 1422 with the UE 104 and/or BS 102/180. The cellular baseband processor 1404 may include a computer-readable medium/memory. The computer-readable medium/memory may be non-transitory. The cellular baseband processor 1404 is responsible for general processing, including the execution of software stored on the computer-readable medium/memory. The software, when executed by the cellular baseband processor 1404, causes the cellular baseband processor 1404 to perform the various functions described supra. The computer-readable medium/memory may also be used for storing data that is manipulated by the cellular baseband processor 1404 when executing software. The cellular baseband processor 1404 further includes a reception component 1430, a communication manager 1432, and a transmission component 1434. The communication manager 1432 includes the one or more illustrated components. The components within the communication manager 1432 may be stored in the computer-readable medium/memory and/or configured as hardware within the cellular baseband processor 1404. The cellular baseband processor 1404 may be a component of the UE 350 and may include the memory 360 and/or at least one of the TX processor 368, the RX processor 356, and the controller/processor 359. In one configuration, the apparatus 1402 may be a modem chip and include just the cellular baseband processor 1404, and in another configuration, the apparatus 1402 may be the entire UE (e.g., see 350 of FIG. 3) and include the additional modules of the apparatus 1402.

The communication manager 1432 includes a RM node identification component 1440 that is configured to receive a polar-encoded transmission including at least one intermediate node associated with a first configuration of frozen leaf nodes and information leaf nodes and identify the at least one intermediate (e.g., RM) node based on a known configuration of frozen and information bits, e.g., as described in connection with 1002, 1102, and 1104 of FIGS. 10 and 11. The communication manager 1432 further includes an FHT component 1442 that is configured to receive input in the form of a set of LLRs associated with the at least one intermediate node from the RM node identification component 1440 and/or an FHT component 1442 and is configured to apply an FHT to a first set of values (e.g., LLRs) associated with a first intermediate node of the at least one intermediate node to generate a second set of values (e.g., $y_i$ for i=0, . . . , 7) associated with the first intermediate node, e.g., as described in connection with 1004 and 1106 of FIGS. 10 and 11. The communication manager 1432 further includes a RM node evaluation component 1444 that is configured to receive input in the form of the second set of values from the FHT component 1442 and is configured to select, based on the second set of values, one or more paths associated with the first intermediate node for a SSCL decoding by selecting a first number of paths by selecting a subset of values in the second set of values, identifying an index associated with each value in the selected subset of values, and identifying, for each value in the subset of values, a corresponding path in the first set of paths, e.g., as described in connection with 1006, 1108, 1208, and 1208A-1208D of FIGS. 10, 11, and 12. The communication manager 1432 further includes a path metric calculation component 1446 that is configured to receive input in the form of the selected one or more paths from the RM node evaluation component 1444 and is configured to calculate a path metric for each of the selected one or more paths associated with the first intermediate node, e.g., as described in connection with 1008 and 1110 of FIGS. 10 and 11. The communication manager 1432 further includes a path selection component 1448 that is configured to receive input in the form of the selected one or more paths and the calculated path metrics from the RM node evaluation component 1444 and the path metric calculation component 1446 and is configured to update, based on the one or more selected paths and the calculated path metrics for each of the selected one or more paths, a list of candidate codewords maintained for the SSCL decoding by generating a list of possible candidate codewords based on the list of candidate codewords and the one or more selected paths, calculating a first path metric for each possible candidate codeword in the list of possible candidate codewords, and removing a third number of codewords with a highest path metric from the list of possible candidate codewords, e.g., as described in connection with 1112, 1312, and 1312A-1312C of FIGS. 11 and 13.

The apparatus may include additional components that perform each of the blocks of the algorithm in the flowcharts of FIGS. 10-13. As such, each block in the flowcharts of FIGS. 10-13 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1402 may include a variety of components configured for various functions. In one configuration, the apparatus 1402, and in particular the cellular baseband processor 1404, includes means for receiving a polar-encoded transmission including at least one intermediate node associated with a first configuration of frozen leaf nodes and information leaf nodes. The apparatus 1402, and in particular the cellular baseband processor 1404, may include means for applying an FHT to a first set of values associated with a first intermediate node of the at least one intermediate node to generate a second set of values associated with the first intermediate node. The apparatus 1402, and in particular the cellular baseband processor 1404, may include means for selecting, based on the second set of values, one or more paths associated with the first intermediate node for a SSCL decoding. The apparatus 1402, and in particular the cellular baseband processor 1404, may include means for calculating a path metric for each of the selected one or more paths associated with the first intermediate node. The apparatus 1402, and in particular the cellular baseband processor 1404, may include means for identifying the at least one intermediate node based on the known configuration. The apparatus 1402, and in particular the cellular baseband processor 1404, may include means for selecting a first number of paths, where the first number of paths is less than, or equal to, a number of candidate codewords maintained by the SSCL decoding after a pruning operation. The apparatus 1402, and in particular the cellular baseband processor 1404, may include means for selecting a subset of values in the second set of values, the selected subset of values including a second number of values having a magnitude greater than one or more values in the second set of values that are not included in the selected subset of values, where the second number of values is equal to the first number of paths and each value in the selected subset of values corresponds to a different path in the first number of paths. The apparatus 1402, and in particular the cellular baseband processor 1404, may include means for identifying an index associated with each value in the selected subset of values. The apparatus 1402, and in particular the cellular baseband processor 1404, may include means for identifying, for each value in the subset of values, a corresponding path in the first number of paths based on the identified index and a sign of the value in the subset of values. The apparatus 1402, and in particular the cellular baseband processor 1404, may include means for updating, based on the one or more selected paths and the calculated path metrics for each of the selected one or more paths, a list of candidate codewords maintained for the SSCL decoding. The apparatus 1402, and in particular the cellular baseband processor 1404, may include means for generating a list of possible candidate codewords based on the list of candidate codewords and the one or more selected paths. The apparatus 1402, and in particular the cellular baseband processor 1404, may include means for calculating a first path metric for each possible candidate codeword in the list of possible candidate codewords. The apparatus 1402, and in particular the cellular baseband processor 1404, may include means for removing a third number of codewords with a highest path metric from the list of possible candidate codewords, where the third number of codewords is based on at least one of a first number of selected paths associated with the first intermediate node or a configured number of candidate codewords to maintain after each successive coding operation of the SSCL decoding. The means may be one or more of the components of the apparatus 1402 configured to perform the functions recited by the means. As described supra, the apparatus 1402 may include the TX Processor 368, the RX Processor 356, and the controller/processor 359. As such, in one configuration, the means may be the TX Processor 368, the RX Processor 356, and the controller/processor 359 configured to perform the functions recited by the means.

Figure 15:
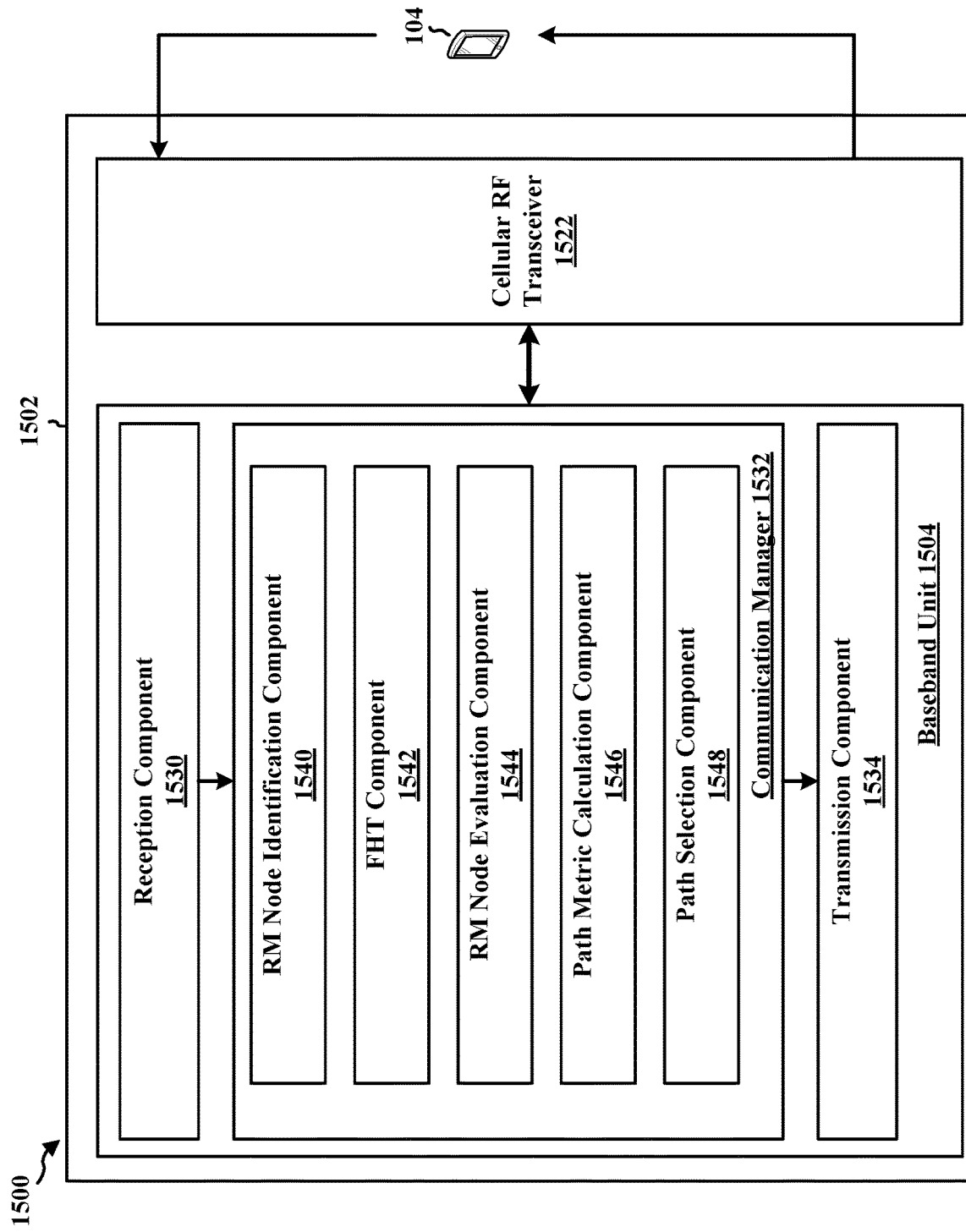
FIG. 15 is a diagram illustrating an example of a hardware implementation for an apparatus, in accordance with aspects of the present disclosure.

FIG. 15 is a diagram 1500 illustrating an example of a hardware implementation for an apparatus 1502. The apparatus 1502 may be a base station, a component of a base station, or may implement base station functionality. In some aspects, the apparatus 1402 may include a baseband unit 1504. The baseband unit 1504 may communicate through a cellular RF transceiver 1522 with the UE 104. The baseband unit 1504 may include a computer-readable medium/memory. The baseband unit 1504 is responsible for general processing, including the execution of software stored on the computer-readable medium/memory. The software, when executed by the baseband unit 1504, causes the baseband unit 1504 to perform the various functions described supra. The computer-readable medium/memory may also be used for storing data that is manipulated by the baseband unit 1504 when executing software. The baseband unit 1504 further includes a reception component 1530, a communication manager 1532, and a transmission component 1534. The communication manager 1532 includes the one or more illustrated components. The components within the communication manager 1532 may be stored in the computer-readable medium/memory and/or configured as hardware within the baseband unit 1504. The baseband unit 1504 may be a component of the base station 310 and may include the memory 376 and/or at least one of the TX processor 316, the RX processor 370, and the controller/processor 375.

The communication manager 1532 includes a RM node identification component 1540 that is configured to receive a polar-encoded transmission including at least one intermediate node associated with a first configuration of frozen leaf nodes and information leaf nodes and identify the at least one intermediate (RM) node based on a known configuration of frozen and information bits, e.g., as described in connection with 1002, 1102, and 1104 of FIGS. 10 and 11. The communication manager 1532 further includes an FHT component 1542 that is configured to receive input in the form of a set of LLRs associated with the at least one intermediate node from the RM node identification component 1540 and/or an FHT component 1542 and is configured to apply an FHT to a first set of values (e.g., LLRs) associated with a first intermediate node of the at least one intermediate node to generate a second set of values (e.g., $y_i$ for i=0, . . . , 7) associated with the first intermediate node, e.g., as described in connection with 1004 and 1106 of FIGS. 10 and 11. The communication manager 1532 further includes a RM node evaluation component 1544 that is configured to receive input in the form of the second set of values from the FHT component 1542 and is configured to select, based on the second set of values, one or more paths associated with the first intermediate node for a SSCL decoding by selecting a first number of paths by selecting a subset of values in the second set of values, identifying an index associated with each value in the selected subset of values, and identifying, for each value in the subset of values, a corresponding path in the first set of paths, e.g., as described in connection with 1006, 1108, 1208, and 1208A-1208D of FIGS. 10, 11, and 12. The communication manager 1532 further includes a path metric calculation component 1546 that is configured to receive input in the form of the selected one or more paths from the RM node evaluation component 1544 and is configured to calculate a path metric for each of the selected one or more paths associated with the first intermediate node, e.g., as described in connection with 1008 and 1110 of FIGS. 10 and 11. The communication manager 1532 further includes a path selection component 1548 that is configured to receive input in the form of the selected one or more paths and the calculated path metrics from the RM node evaluation component 1544 and the path metric calculation component 1546 and is configured to update, based on the one or more selected paths and the calculated path metrics for each of the selected one or more paths, a list of candidate codewords maintained for the SSCL decoding by generating a list of possible candidate codewords based on the list of candidate codewords and the one or more selected paths, calculating a first path metric for each possible candidate codeword in the list of possible candidate codewords, and removing a third number of codewords with a highest path metric from the list of possible candidate codewords, e.g., as described in connection with 1112, 1312, and 1312A-1312C of FIGS. 11 and 13.

The apparatus may include additional components that perform each of the blocks of the algorithm in the flowcharts of FIGS. 10-13. As such, each block in the flowcharts of FIGS. 10-13 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1502 may include a variety of components configured for various functions. In one configuration, the apparatus 1502, and in particular the baseband unit 1504, includes means for receiving a polar-encoded transmission including at least one intermediate node associated with a first configuration of frozen leaf nodes and information leaf nodes. The apparatus 1502, and in particular the baseband unit 1504, may include means for applying an FHT to a first set of values associated with a first intermediate node of the at least one intermediate node to generate a second set of values associated with the first intermediate node. The apparatus 1502, and in particular the baseband unit 1504, may include means for selecting, based on the second set of values, one or more paths associated with the first intermediate node for a SSCL decoding. The apparatus 1502, and in particular the baseband unit 1504, may include means for calculating a path metric for each of the selected one or more paths associated with the first intermediate node. The apparatus 1502, and in particular the baseband unit 1504, may include means for identifying the at least one intermediate node based on the known configuration. The apparatus 1502, and in particular the baseband unit 1504, may include means for selecting a first number of paths, where the first number of paths is less than, or equal to, a number of candidate codewords maintained by the SSCL decoding after a pruning operation. The apparatus 1502, and in particular the baseband unit 1504, may include means for selecting a subset of values in the second set of values, the selected subset of values including a second number of values having a magnitude greater than one or more values in the second set of values that are not included in the selected subset of values, where the second number of values is equal to the first number of paths and each value in the selected subset of values corresponds to a different path in the first number of paths. The apparatus 1502, and in particular the baseband unit 1504, may include means for identifying an index associated with each value in the selected subset of values. The apparatus 1502, and in particular the baseband unit 1504, may include means for identifying, for each value in the subset of values, a corresponding path in the first number of paths based on the identified index and a sign of the value in the subset of values. The apparatus 1502, and in particular the baseband unit 1504, may include means for updating, based on the one or more selected paths and the calculated path metrics for each of the selected one or more paths, a list of candidate codewords maintained for the SSCL decoding. The apparatus 1502, and in particular the baseband unit 1504, may include means for generating a list of possible candidate codewords based on the list of candidate codewords and the one or more selected paths. The apparatus 1502, and in particular the baseband unit 1504, may include means for calculating a first path metric for each possible candidate codeword in the list of possible candidate codewords. The apparatus 1502, and in particular the baseband unit 1504, may include means for removing a third number of codewords with a highest path metric from the list of possible candidate codewords, where the third number of codewords is based on at least one of a first number of selected paths associated with the first intermediate node or a configured number of candidate codewords to maintain after each successive coding operation of the SSCL decoding. The means may be one or more of the components of the apparatus 1502 configured to perform the functions recited by the means. As described supra, the apparatus 1502 may include the TX Processor 316, the RX Processor 370, and the controller/processor 375. As such, in one configuration, the means may be the TX Processor 316, the RX Processor 370, and the controller/processor 375 configured to perform the functions recited by the means.

In some aspects of polar decoding, a parent node may be a special node for which faster and/or simpler processing may be performed. The polar decoding, in such, aspects may be a simplified SC (SSC) decoding that takes advantage of the ability to perform faster and/or simpler processing for the special nodes. For example, instead of traversing a subtree/subnodes associated with a special node simpler methods and/or calculations may be performed to decode the information bits associated with the special node. In some aspects, the special nodes are identified based on an identification of which bits contain information and which bits do not contain information (e.g., are frozen bits). The special nodes may be, e.g., a rate-0 node for which all input bits are frozen bits, a rate-1 node for which all input bits are information bits, a repetition (fast SSC) node for which all inputs are frozen except the last one, or an SPC (fast SSC) node for which all bits are information bits except the first bit.

SSCL decoding may be further improved by adding additional types of special nodes that may be processed more quickly. Aspects presented herein introduce an additional special node for SSCL (or SSC) decoding to provide further improvements over a SC decoding or SCL decoding. The additional special node may be a reed-muller node associated with 8 bits defined by having a frozen leaf node (e.g., a frozen bit) at each of a first leaf node, a second leaf node, a third leaf node, and a fifth leaf node and having an information leaf node (e.g., an information bit) at each of a fourth leaf node, a sixth leaf node, a seventh leaf node, and an eighth leaf node. Aspects presented herein may further provide a method for a simple and/or fast decoding of a reed-muller node and a calculation of a path metric used in selecting a set of candidate paths for a SSCL decoding.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is an apparatus for wireless communication including at least one processor coupled to a memory and configured to receive a polar-encoded transmission including at least one intermediate node associated with a first configuration of frozen leaf nodes and information leaf nodes, apply an FHT to a first set of values associated with a first intermediate node of the at least one intermediate node to generate a second set of values associated with the first intermediate node, select, based on the second set of values, one or more paths associated with the first intermediate node for a SSCL decoding, and calculate a path metric for each of the selected one or more paths associated with the first intermediate node.

Aspect 2 is the apparatus of aspect 1, where the at least one intermediate node includes at least one Reed-Muller node associated with a set of eight leaf nodes and the first configuration of the frozen leaf nodes and the information leaf nodes includes a frozen leaf node at a first leaf node, a second leaf node, a third leaf node, and a fifth leaf node and an information leaf node at a fourth leaf node, a sixth leaf node, a seventh leaf node, and an eighth leaf node.

Aspect 3 is the apparatus of aspect 2, where the received polar-encoded transmission is associated with a known configuration of the frozen leaf nodes and the information leaf nodes including the first configuration, where the at least one processor is further configured to identify the at least one intermediate node based on the known configuration Aspect 4 is the apparatus of any of aspects 1 to 3, where the first set of values associated with the first intermediate node includes a set of log likelihood ratio values calculated based on the received polar encoded transmission and the path metric is calculated based on the first set of values and the second set of values.

Aspect 5 is the apparatus of any of aspects 1 to 4, where to select the one or more paths, the at least one processor is configured to select a first number of paths, where the first number of paths is less than, or equal to, a number of candidate codewords maintained by the SSCL decoding after a pruning operation.

Aspect 6 is the apparatus of aspect 5, where to select the first number of paths, the at least one processor is configured to select a subset of values in the second set of values, the selected subset of values including a second number of values having a magnitude greater than one or more values in the second set of values that are not included in the selected subset of values, where the second number of values is equal to the first number of paths and each value in the selected subset of values corresponds to a different path in the first number of paths.

Aspect 7 is the apparatus of aspect 6, where to select the first number of paths, the at least one processor is further configured to identify an index associated with each value in the selected subset of values and identify, for each value in the subset of values, a corresponding path in the first number of paths based on the identified index and a sign of the value in the subset of values.

Aspect 8 is the apparatus of aspect 7, where, for each value in the subset of values, the identified index identifies expected values for three bits of encoded information, and where an expected value for a fourth bit of the encoded information is identified based on the expected values for the three bits of the encoded information and the sign of the value in the subset of values.

Aspect 9 is the apparatus of aspect 8, where a binary representation of each index associated with a value in the second set of values corresponds to the expected value of the three bits in a particular order, where the particular order is a same order for each index.

Aspect 10 is the apparatus of any of aspects 1 to 9, where to calculate the path metric for a particular selected path of the one or more selected paths the at least one processor is configured to calculate the path metric for the particular selected path based on the first set of values associated with the first intermediate node and the second set of values associated with the first intermediate node.

Aspect 11 is the apparatus of aspect 10, where calculating the path metric for the particular selected path based on the first set of values associated with the first intermediate node and the second set of values associated with the first intermediate node includes calculating a first value based on a difference between a magnitude of a second value in the second set of values that corresponds to the particular selected path and a sum of magnitudes of values in the first set of values.

Aspect 12 is the apparatus of any of aspects 1 to 11, where the first wireless device is at least one of a network node, a network entity, a base station, or a UE.

Aspect 13 is the apparatus of any of aspects 1 to 12, where the at least one processor is further configured to update, based on the one or more selected paths and the calculated path metrics for each of the selected one or more paths, a list of candidate codewords maintained for the SSCL decoding.

Aspect 14 is the apparatus of aspect 13, where to update the list of candidate codewords maintained for the SSCL decoding, the at least one processor is configured to generate a list of possible candidate codewords based on the list of candidate codewords and the one or more selected paths, calculate a first path metric for each possible candidate codeword in the list of possible candidate codewords, and remove a third number of codewords with a highest path metric from the list of possible candidate codewords, where the third number of codewords is based on at least one of a first number of selected paths associated with the first intermediate node or a configured number of candidate codewords to maintain after each successive coding operation of the SSCL decoding.

Aspect 15 is the apparatus of any of aspects 1 to 14, further including a transceiver coupled to the at least one processor.

Aspect 16 is a method of wireless communication for implementing any of aspects 1 to 15.

Aspect 17 is an apparatus for wireless communication including means for implementing any of aspects 1 to 15.

Aspect 18 is a non-transitory computer-readable medium storing computer executable code, where the code when executed by a processor causes the processor to implement any of aspects 1 to 15.

What is claimed is:

1. A first wireless device for wireless communication, comprising:
    a memory; and
    at least one processor coupled to the memory, wherein the processor is configured to:
        receive a polar-encoded transmission comprising at least one intermediate node associated with a first configuration of frozen leaf nodes and information leaf nodes;
        apply a Fast Hadamard Transform (FHT) to a first set of values associated with a first intermediate node of the at least one intermediate node to generate a second set of values associated with the first intermediate node;
        select, based on the second set of values, one or more paths associated with the first intermediate node for a simplified successive cancellation list (SSCL) decoding;
        calculate a path metric for each of the selected one or more paths associated with the first intermediate node; and
        identify a path in the one or more paths based on the calculated path metric for each of the selected one or more paths associated with the first intermediate node, wherein the path is indicative of decoded data corresponding to the polar-encoded transmission.

2. The first wireless device of claim 1, wherein the at least one intermediate node comprises at least one Reed-Muller node associated with a set of eight leaf nodes and the first configuration of the frozen leaf nodes and the information leaf nodes comprises a frozen leaf node at a first leaf node, a second leaf node, a third leaf node, and a fifth leaf node and an information leaf node at a fourth leaf node, a sixth leaf node, a seventh leaf node, and an eighth leaf node.

3. The first wireless device of claim 2, wherein the received polar-encoded transmission is associated with a known configuration of the frozen leaf nodes and the information leaf nodes comprising the first configuration, wherein the at least one processor is further configured to:
    identify the at least one intermediate node based on the known configuration.

4. The first wireless device of claim 1, wherein the first set of values associated with the first intermediate node comprises a set of log likelihood ratio values calculated based on the received polar-encoded transmission, and wherein to calculate the path metric, the at least one processor is configured to calculate the path metric based on the first set of values and the second set of values.

5. The first wireless device of claim 1, wherein to select the one or more paths, the at least one processor is configured to:
    select a first number of paths, wherein the first number of paths is less than, or equal to, a number of candidate codewords maintained by the SSCL decoding after a pruning operation.

6. The first wireless device of claim 5, wherein to select the first number of paths, the at least one processor is configured to:
    select a subset of values in the second set of values, the selected subset of values comprising a second number of values having a magnitude greater than one or more values in the second set of values that are not included in the selected subset of values, wherein the second number of values is equal to the first number of paths and each value in the selected subset of values corresponds to a different path in the first number of paths.

7. The first wireless device of claim 6, wherein to select the first number of paths, the at least one processor is further configured to:
    identify an index associated with each value in the subset of values; and
    identify, for each value in the subset of values, a corresponding path in the first number of paths based on the identified index and a sign of the value in the subset of values.

8. The first wireless device of claim 7, wherein, for each value in the subset of values, the identified index identifies expected values for three bits of encoded information, and wherein an expected value for a fourth bit of the encoded information is identified based on the expected values for the three bits of the encoded information and the sign of the value in the subset of values.

9. The first wireless device of claim 8, wherein a binary representation of each index associated with a value in the second set of values corresponds to the expected value of the three bits in a particular order, wherein the particular order is a same order for each index.

10. The first wireless device of claim 1, wherein to calculate the path metric for a particular selected path of the one or more selected paths, the at least one processor is configured to:
    calculate the path metric for the particular selected path based on the first set of values associated with the first intermediate node and the second set of values associated with the first intermediate node.

11. The first wireless device of claim 10, wherein to calculate the path metric for the particular selected path based on the first set of values associated with the first intermediate node and the second set of values associated with the first intermediate node, the at least one processor is configured to calculate a first value based on a difference between a magnitude of a second value in the second set of values that corresponds to the particular selected path and a sum of magnitudes of values in the first set of values.

12. The first wireless device of claim 1, wherein the first wireless device is at least one of a network node, a network entity, a base station, or a user equipment (UE).

13. The first wireless device of claim 1, wherein the at least one processor is further configured to:
update, based on the one or more selected paths and the calculated path metric for each of the selected one or more paths, a list of candidate codewords maintained for the SSCL decoding.

14. The first wireless device of claim 13, wherein to update the list of candidate codewords maintained for the SSCL decoding, the at least one processor is configured to:
generate a list of possible candidate codewords based on the list of candidate codewords and the one or more selected paths;
calculate a first path metric for each possible candidate codeword in the list of possible candidate codewords; and
remove a third number of codewords with a highest path metric from the list of possible candidate codewords, wherein the third number of codewords is based on at least one of a first number of selected paths associated with the first intermediate node or a configured number of candidate codewords to maintain after each successive coding operation of the SSCL decoding.

15. The first wireless device of claim 1 further comprising a transceiver coupled to the at least one processor.

16. A method of wireless communication performed by a first wireless device, comprising:
receiving a polar-encoded transmission comprising at least one intermediate node associated with a first configuration of frozen leaf nodes and information leaf nodes;
applying a Fast Hadamard Transform (FHT) to a first set of values associated with a first intermediate node of the at least one intermediate node to generate a second set of values associated with the first intermediate node;
selecting, based on the second set of values, one or more paths associated with the first intermediate node for a simplified successive cancellation list (SSCL) decoding;
calculating a path metric for each of the selected one or more paths associated with the first intermediate node; and
identifying a path in the one or more paths based on the calculated path metric for each of the selected one or more paths associated with the first intermediate node, wherein the path is indicative of decoded data corresponding to the polar-encoded transmission.

17. The method of claim 16, wherein the at least one intermediate node comprises at least one Reed-Muller node associated with a set of eight leaf nodes and the first configuration of the frozen leaf nodes and the information leaf nodes comprises a frozen leaf node at a first leaf node, a second leaf node, a third leaf node, and a fifth leaf node and an information leaf node at a fourth leaf node, a sixth leaf node, a seventh leaf node, and an eighth leaf node.

18. The method of claim 17, wherein the received polar-encoded transmission is associated with a known configuration of the frozen leaf nodes and the information leaf nodes comprising the first configuration, and further comprising:
identifying the at least one intermediate node based on the known configuration.

19. The method of claim 16, wherein the first set of values associated with the first intermediate node comprises a set of log likelihood ratio values calculated based on the received polar-encoded transmission and the path metric is calculated based on the first set of values and the second set of values.

20. The method of claim 16, wherein selecting the one or more paths comprises:
selecting a first number of paths, wherein the first number of paths is less than, or equal to, a number of candidate codewords maintained by the SSCL decoding after a pruning operation.

21. The method of claim 20, wherein selecting the first number of paths comprises:
selecting a subset of values in the second set of values, the selected subset of values comprising a second number of values having a magnitude greater than one or more values in the second set of values that are not included in the selected subset of values, wherein the second number of values is equal to the first number of paths and each value in the selected subset of values corresponds to a different path in the first number of paths.

22. The method of claim 21, wherein selecting the first number of paths further comprises:
identifying an index associated with each value in the selected subset of values; and
identifying, for each value in the subset of values, a corresponding path in the first number of paths based on the identified index and a sign of the value in the subset of values.

23. The method of claim 22, wherein, for each value in the subset of values, the identified index identifies expected values for three bits of encoded information, and wherein an expected value for a fourth bit of the encoded information is identified based on the expected values for the three bits of the encoded information and the sign of the value in the subset of values.

24. The method of claim 23, wherein a binary representation of each index associated with a value in the second set of values corresponds to the expected value of the three bits in a particular order, wherein the particular order is a same order for each index.

25. The method of claim 16, wherein calculating the path metric for a particular selected path of the one or more selected paths further comprises calculating the path metric for the particular selected path based on the first set of values associated with the first intermediate node and the second set of values associated with the first intermediate node.

26. The method of claim 25, wherein calculating the path metric for the particular selected path comprises calculating a first value based on a difference between a magnitude of a second value in the second set of values that corresponds to the particular selected path and a sum of magnitudes of values in the first set of values.

27. The method of claim 16, wherein the first wireless device is at least one of a network node, a network entity, a base station, or a user equipment (UE), further comprising:
updating, based on the one or more selected paths and the calculated path metric for each of the selected one or more paths, a list of candidate codewords maintained for the SSCL decoding.

28. The method of claim 27, wherein updating the list of candidate codewords maintained for the SSCL decoding comprises:

generating a list of possible candidate codewords based on the list of candidate codewords and the one or more selected paths;

calculating a first path metric for each possible candidate codeword in the list of possible candidate codewords; and removing a third number of codewords with a highest path metric from the list of possible candidate codewords, wherein the third number of codewords is based on at least one of a first number of selected paths associated with the first intermediate node or a configured number of candidate codewords to maintain after each successive coding operation of the SSCL decoding.

29. A first wireless device for wireless communication, comprising:

means for receiving a polar-encoded transmission comprising at least one intermediate node associated with a first configuration of frozen leaf nodes and information leaf nodes;

means for applying a Fast Hadamard Transform (FHT) to a first set of values associated with a first intermediate node of the at least one intermediate node to generate a second set of values associated with the first intermediate node;

means for selecting, based on the second set of values, one or more paths associated with the first intermediate node for a simplified successive cancellation list (SSCL) decoding;

means for calculating a path metric for each of the selected one or more paths associated with the first intermediate node; and means for identifying a path in the one or more paths based on the calculated path metric for each of the selected one or more paths associated with the first intermediate node, wherein the path is indicative of decoded data corresponding to the polar-encoded transmission.

30. A non-transitory computer-readable medium having computer executable code stored thereon that, when executed by a processor, causes the processor to:

receive a polar-encoded transmission comprising at least one intermediate node associated with a first configuration of frozen leaf nodes and information leaf nodes;

apply a Fast Hadamard Transform (FHT) to a first set of values associated with a first intermediate node of the at least one intermediate node to generate a second set of values associated with the first intermediate node;

select, based on the second set of values, one or more paths associated with the first intermediate node for a simplified successive cancellation list (SSCL) decoding;

calculate a path metric for each of the selected one or more paths associated with the first intermediate node; and identify a path in the one or more paths based on the calculated path metric for each of the selected one or more paths associated with the first intermediate node, wherein the path is indicative of decoded data corresponding to the polar-encoded transmission.

* * * * *